(12) United States Patent
Hsu

(10) Patent No.: US 9,274,419 B2
(45) Date of Patent: Mar. 1, 2016

(54) BLUE PHOTOSENSITIVE RESIN COMPOSITION FOR COLOR FILTER AND APPLICATION THEREOF

(71) Applicant: CHI MEI CORPORATION, Tainan City (TW)

(72) Inventor: Jung-Pin Hsu, Tainan (TW)

(73) Assignee: CHI MEI CORPORATION, Tainan (TW)

( * ) Notice: Subject to any disclaimer, the term of this patent is extended or adjusted under 35 U.S.C. 154(b) by 0 days.

(21) Appl. No.: 14/645,402

(22) Filed: Mar. 11, 2015

(65) Prior Publication Data
US 2015/0268554 A1 Sep. 24, 2015

(30) Foreign Application Priority Data
Mar. 24, 2014 (TW) .............................. 103110904 A

(51) Int. Cl.
| | |
|---|---|
| *G02F 1/1335* | (2006.01) |
| *G03F 7/033* | (2006.01) |
| *G03F 7/00* | (2006.01) |
| *G03F 7/30* | (2006.01) |
| *G02B 1/04* | (2006.01) |
| *G02B 5/22* | (2006.01) |
| *G02B 5/20* | (2006.01) |

(52) U.S. Cl.
CPC ................ *G03F 7/0007* (2013.01); *G02B 1/04* (2013.01); *G02B 5/223* (2013.01); *G02F 1/133516* (2013.01); *G03F 7/033* (2013.01); *G03F 7/30* (2013.01); *G02B 5/201* (2013.01)

(58) Field of Classification Search
CPC ......... G03F 7/0007; G03F 7/30; G03F 7/032; G03F 7/033; G02F 1/133516; G02B 5/23; G02B 5/223; G02B 1/04
USPC .............................................. 430/7; 349/106
See application file for complete search history.

(56) References Cited

U.S. PATENT DOCUMENTS

2013/0222738 A1* 8/2013 Hsieh ................ G02F 1/133514 349/69

FOREIGN PATENT DOCUMENTS

| JP | 09-95638 A | | 4/1997 |
|---|---|---|---|
| JP | 09-197663 A | | 7/1997 |
| JP | 2006-079012 A | | 3/2006 |
| JP | 2010-054808 A | * | 3/2010 |
| JP | 2014-041322 A | * | 3/2014 |
| KR | 2011-0109033 A | * | 10/2011 |
| TW | 201300467 A | | 1/2013 |
| TW | 201335670 A | | 9/2013 |
| TW | 201344354 A | | 11/2013 |

OTHER PUBLICATIONS

Computer-generated translation of JP 2010-054808 (Mar. 2010).*
Computer-generated translation of JP 2014-041322 (Mar. 2014).*
Computer-generated translation of KR 2011-0109033 (Oct. 2011).*

* cited by examiner

*Primary Examiner* — John A McPherson
(74) *Attorney, Agent, or Firm* — CKC & Partners Co., Ltd.

(57) ABSTRACT

The present invention relates to a blue photosensitive resin composition for a color filter and an application thereof. The blue photosensitive resin composition includes an organic pigment (A), a dye (B), an alkali-soluble resin (C), a compound having an ethylenically unsaturated group (D), a photo-initiator (E) and a solvent (F). The alkali-soluble resin (C) includes a first alkali-soluble resin (C-1) having a hindered amine structure. The blue photosensitive resin composition of the present invention can improve a voltage holding ratio and a contrast ratio of the color filter.

10 Claims, 2 Drawing Sheets

BLUE PHOTOSENSITIVE RESIN COMPOSITION FOR COLOR FILTER AND APPLICATION THEREOF

RELATED APPLICATIONS

This application claims priority to Taiwan Application Serial Number 103110904, filed on Mar. 24, 2014, which is herein incorporated by reference.

BACKGROUND

1. Field of Invention

The present invention relates to a blue photosensitive resin composition for a color filter and a color filter formed by the blue photosensitive resin composition of liquid crystal display (LCD) device thereof. More particularly, the present invention relates a blue photosensitive resin composition for a color filter having excellent voltage holding ratio and contrast ratio.

2. Description of Related Art

With the upgrading technology and wider application of the liquid crystal display (LCD), the large LCD (for example, LC television) is under progressively developing. Typically, the National Television System Committee (NTSC) ratio of the color reproducibility of the desktop LCD is approximately 50% to 60%, while the NTSC ratio of the LC television is approximately 60% to 75%. Thus, when the components of the desktop LCD, for example, the LCD components and the backlight components (e.g., cold cathode fluorescent lamp; CCFL) being applied in the LC television, such LC television cannot meet the requirements on the color reproducibility of the LC television.

To make the LC television with a desired specification of the color reproducibility, when the backlight component of the desktop LCD is used, the film thickness or the pigment concentration of the blue filter portion of the color filter in the LC television must be increased. However, such practices will drastically eliminate the transmittance of the blue filter portion.

The Japanese patent publication No. H09-95638 discloses a blue photosensitive resin composition for a color filter, and the composition includes an alpha-copper phthalocyanine blue pigment, an epsilon-copper phthalocyanine, a photosensitive resin, a photo-initiator and a solvent. Besides, the Japanese patent publication No. H09-197663 also discloses a blue photosensitive resin composition for a color filter, and the composition includes a copper phthalocyanine blue pigment, an indanthrone blue pigment, a photosensitive resin, a photo-initiator and a solvent.

In the aforementioned two patents, the transmittance of the blue photosensitive resin composition is improved by using different kinds of blue pigments. However, due to the light scattering generated by the pigment particles having certain diameters, if the concentration of the pigment of the blue photosensitive resin is increased, the color filter having such blue photosensitive resin composition will result in decreased contrast ratio. Thus, the Japanese patent publication No. 2006-079012 discloses the combination of a light-absorbing pyrazole squarylium and a blue pigment (Pigment Blue; P.B.) 15:6, so as to enhance the contrast ratio of the color filter. However, the method easily causes less voltage holding ratio of the photosensitive resin composition, resulting in the defect of the retained image on the LCD screen.

Thus, the research of the invention in the technical field is aimed to enhance the voltage holding ratio and the contrast ratio of the LCD device for meeting the current requirements of the industry field.

SUMMARY

Therefore, an aspect of the present invention provides a blue photosensitive resin composition for a color filter. The blue photosensitive resin composition can enhance the voltage holding ratio and the contrast ratio of the color filter.

Another aspect of the present invention provides a method of producing a color filter, in which the aforementioned blue photosensitive resin composition for the color filter is employed to form a pixel layer.

A further aspect of the present invention provides a color filter produced by the aforementioned method.

A further aspect of the present invention provides a LCD device, which includes the aforementioned color filter.

According to the aforementioned aspects of the invention, a blue photosensitive resin composition for a color filter is provided, which comprises an organic pigment (A), a dye (B), an alkali-soluble resin (C), a compound having an ethylenically unsaturated group (D), a photo-initiator (E) and a solvent (F), all of which are described in detail as follows.

Blue Photosensitive Resin Composition

Organic Pigment (A)

The organic pigment (A) of the invention is a blue pigment. Preferably, the organic pigment (A) comprises a blue organic pigment mainly having a structure of copper phthalocyanine (A-1).

Blue Organic Pigment Mainly Having Structure of Copper Phthalocyanine (A-1)

The blue organic pigment mainly having the structure of copper phthalocyanine (A-1) includes but is not limited to C.I. Pigment blue 15:1 (C.I. PB15:1), C.I. Pigment blue 15:2 (C.I. PB15:2), C.I. Pigment blue 15:3 (C.I. PB15:3), C.I. Pigment blue 15:4 (C.I. PB15:4), C.I. Pigment blue 15:5 (C.I. PB15:5) or C.I. Pigment blue 15:6 (C.I. PB15:6). The blue organic pigment mainly having the structure of copper phthalocyanine (A-1) can be used alone or in a combination thereof.

Based on a total amount of the following alkali-soluble resin (C) as 100 parts by weight, an amount of the blue organic pigment mainly having the structure of copper phthalocyanine (A-1) is 20 parts by weight to 200 parts by weight, preferably 30 parts by weight to 180 parts by weight, and more preferably 40 parts by weight to 160 parts by weight.

When the organic pigment of the present invention (A) comprises the blue organic pigment mainly having the structure of copper phthalocyanine (A-1), the produced blue photosensitive resin composition can enhance the contrast ratio of the color filter.

Purple Organic Pigment (A-2)

In addition to the aforementioned blue organic pigment mainly having the structure of copper phthalocyanine (A-1), the organic pigment (A) can optionally include a purple organic pigment (A-2).

The purple organic pigment (A-2) can include but be not limited to C.I. Pigment purple 14 (C.I. PV14), C.I. Pigment purple 19 (C.I. PV19), C.I. Pigment purple 23 (C.I. PV23), C.I. Pigment purple 29 (C.I. PV29), C.I. Pigment purple 32 (C.I. PV32), C.I. Pigment purple 33 (C.I. PV33), C.I. Pigment purple 36 (C.I. PV36), C.I. Pigment purple 37 (C.I. PV37), C.I. Pigment purple 38 (C.I. PV38), C.I. Pigment purple 40 (C.I. PV40) or C.I. Pigment purple 50 (C.I. PV50). The aforementioned purple organic pigment (A-2) can be used alone or in a combination of two or more.

Based on the total amount of the alkali-soluble resin (C) as 100 parts by weight, an amount of the purple organic pigment (A-2) is 10 parts by weight to 100 parts by weight, preferably 15 parts by weight to 90 parts by weight, and more preferably 20 parts by weight to 80 parts by weight.

When the organic pigment (A) of the invention comprises the purple organic pigment (A-2), the produced blue photosensitive resin composition can further enhance the contrast ratio of the color filter.

Blue Pigment (A-3) Except from Blue Organic Pigment Mainly Having Structure of Copper Phthalocyanine (A-1)

The organic pigment (A) can optionally include the blue pigment (A-3) except from the blue organic pigment mainly having the structure of copper phthalocyanine (A-1). The blue pigment (A-3) can include but be not limited to C.I. Pigment blue 1, C.I. Pigment blue 21, C.I. Pigment blue 22, C.I. Pigment blue 60, C.I. Pigment blue 61 or C.I. Pigment blue 64. The aforementioned blue pigment (A-3) can be used alone or in a combination of two or more.

Green Pigment (A-4) Mainly Having Structure of Halogenated Phthalocyanine

For adjusting the chromaticity of the blue photosensitive resin composition, the organic pigment (A) can optionally include a green pigment mainly having a structure of halogenated phthalocyanine (A-4).

The green pigment mainly having the structure of halogenated phthalocyanine (A-4) can include but be not limited to C.I. Pigment green 07, C.I. Pigment green 36, C.I. Pigment green 37, C.I. Pigment green 42 or C.I. Pigment green 58. More preferably, the green pigment mainly having the structure of halogenated phthalocyanine (A-4) is C.I. Pigment green 07, C.I. Pigment green 36, C.I. Pigment green 37, C.I. Pigment green 42, C.I. Pigment green 58 or the combination thereof. The aforementioned green pigment mainly having the structure of halogenated phthalocyanine (A-4) can be used alone or in a combination of two or more.

Dye (B)

The dye (B) of the present invention is a red dye having a structure as the formula (I):

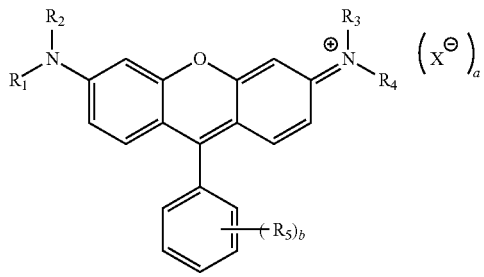

formula (I)

in the formula (I), the $R_1$ to the $R_4$ individually and independently represents a hydrogen atom, $-R_6$, an aromatic hydroxyl group having 6 to 10 carbon atoms or the aromatic hydroxyl group having 6 to 10 carbon atoms substituted by a halogen atom, $-R_6$, $-OH$, $-OR_6$, $-SO_3^-$, $-SO_3H$, $-SO_3M$, $-COOH$, $-COOR_6$, $-SO_3R_6$, $-SO_2NHR_8$ or $-SO_2NR_8R_9$; the $R_5$ represents $-SO_3^-$, $-SO_3H$, $-SO_3M$, $-COOH$, $-COOR_6$, $-SO_3R_6$, $-SO_2NHR_8$ or $-SO_2NR_8R_9$; the X represents a halogen atom; and the a represents 0 or 1 and the b represents an integer of 0 to 5.

When the b is 2 to 5, a plurality of the $R_5$ is the same or different from each other. The aforementioned $R_6$, $R_8$, $R_9$ and M are described as follows.

The aforementioned $R_6$ represents an alkyl group of 1 to 10 carbon atoms or the alkyl group of 1 to 10 carbon atoms substituted by a halogen atom, in which the $-CH_2-$ in the alkyl group of 1 to 10 carbon atoms or the alkyl group of 1 to 10 carbon atoms substituted by the halogen atom is unsubstituted or can be substituted by $-O-$, carbonyl group or $-NR_7-$. The $R_7$ represents an alkyl group of 1 to 10 carbon atoms or the alkyl group of 1 to 10 carbon atoms substituted by a halogen atom.

The aforementioned $R_8$ and the $R_9$ independently and individually represents a linear or a branched alkyl group of 1 to 10 carbon atoms, a cycloalkyl group of 3 to 30 carbon atoms, or -Q. The Q represents an aromatic hydroxyl group of 6 to 10 carbon atoms, a heterocyclic aromatic group of 5 to 10 carbon atoms. Furthermore, the Q can also represent the aromatic hydroxyl group of 6 to 10 carbon atoms substituted by a halogen atom, $-R_6$, $-OH$, $-OR_6$, $-NO_2$, $-CH=CH_2$ or $-CH=CH-R_6$, or a heterocyclic aromatic group of 5 to 10 carbon atoms substituted by a halogen atom, $-R_6$, $-OH$, $-OR_6$, $-NO_2$, $-CH=CH_2$ or $-CH=CH-R_6$, in which the $R_6$ is defined as above.

When the $R_8$ and the $R_9$ independently and individually represents a linear or a branched alkyl group of 1 to 10 carbon atoms, or a cycloalkyl group of 3 to 30 carbon atoms, the hydrogen atom of the linear alkyl, branched alkyl or cycloalkyl group is unsubstituted or can be substituted by a substituent, in which the substituent is selected from the group consisting of a hydroxyl group, a halogen atom, -Q, $-CH=CH_2$ and $-CH=CH-R_6$, and the Q and the $R_6$ are defined as above.

When the $R_8$ and the $R_9$ independently and individually represents a linear or a branched alkyl groups of 1 to 10 carbon atoms, or a cycloalkyl group of 3 to 30 carbon atoms, the $-CH_2-$ group in the linear alkyl, branched alkyl or cycloalkyl group is unsubstituted or can be substituted by $-O-$, carboxyl group or $-NR_7-$. The $R_7$ is defined as above-mentioned.

The aforementioned $R_6$ and the $R_9$ can bound to form a heterocyclic group of 1 to 10 carbon atoms, in which a hydrogen atom in the heterocyclic group of 1 to 10 carbon atoms is unsubstituted or can be substituted by $-R_6$, $-OH$ or -Q, and the Q and the $R_6$ are defined as the above-mentioned description.

The aforementioned M represents potassium or sodium.

Preferably, the aforementioned $R_6$ can be methyl, ethyl, propyl, isopropyl, butyl, isobutyl, pentyl, isopentyl, neopentyl, cyclopentyl, hexyl, cyclohexyl, heptyl, cycloheptyl, octyl, cyclooctyl, 2-ethylhexyl, nonyl, decyl, tricyclo $(5.3.0.0^{3,10})$ decyl, methoxy propyl, hexyloxy propyl, 2-ethyl hexyloxy propyl, methoxy hexyl or epoxy propyl group.

Among the aforementioned $R_1$ to $R_4$, the aromatic hydroxyl group of 6 to 10 carbon atoms can preferably be a benzene group or a naphthalene group.

Among the aforementioned $R_1$ to $R_5$, the $-SO_3R_6$ can be methylsulfonyl, ethylsulfonyl, hexylsulfonyl or decylsulfonyl group.

Among the aforementioned $R_1$ to $R_5$, the $-COOR_6$ can be methoxycarbonyl, ethoxycarbonyl, propoxycarbonyl, isopropoxycarbonyl, butoxycarbonyl, isobutoxycarbonyl, pentyloxycarbonyl, isopentyloxycarbonyl, neopentyloxycarbonyl, cyclopentyloxycarbonyl, hexyloxycarbonyl, cyclohexyloxycarbonyl, heptyloxycarbonyl, cycloheptyloxycarbonyl, octyloxycarbonyl, cyclooctyloxycarbonyl, 2-ethylhexyloxycarbonyl, nonyloxycarbonyl, decyloxycarbonyl, tricyclo[5.3.0.0$^{3,10}$]decylcarbonyl, methoxypropoxycarbonyl, hexyloxypropoxycarbonyl, 2-ethylhexyloxypropoxycarbonyl or methoxyhexyloxycarbonyl group.

Among the aforementioned $R_1$ to $R_5$, the —$SO_2NHR_8$ can be sulfamoyl, methylsulfamoyl, ethylsulfamoyl, propylsulfamoyl, isopropylsulfamoyl, butylsulfamoyl, isobutylsulfamoyl, pentylsulfamoyl, isopentylsulfamoyl, neopentylsulfamoyl, cyclopentylsulfamoyl, hexylsulfamoyl, cyclohexylsulfamoyl, heptylsulfamoyl, cycloheptylsulfamoyl, octylsulfamoyl, cyclooctylsulfamoyl, 2-ethylhexylsulfamoyl, nonylsulfamoyl, decylsulfamoyl, tricyco[5.3.0.0$^{3,10}$]decylsulfamoyl, methoxypropylsulfamoyl, hexyloxypropylsulfamoyl, 2-ethylhexyloxypropylsulfamoyl, methoxyhexylsulfamoyl, epoxypropylsulfamoyl, 1,5-dimethylhexylsulfamoyl, propoxypropylsulfamoyl, isopropoxypropylsulfamoyl, 3-phenyl-1-methylpropylsulfamoyl,

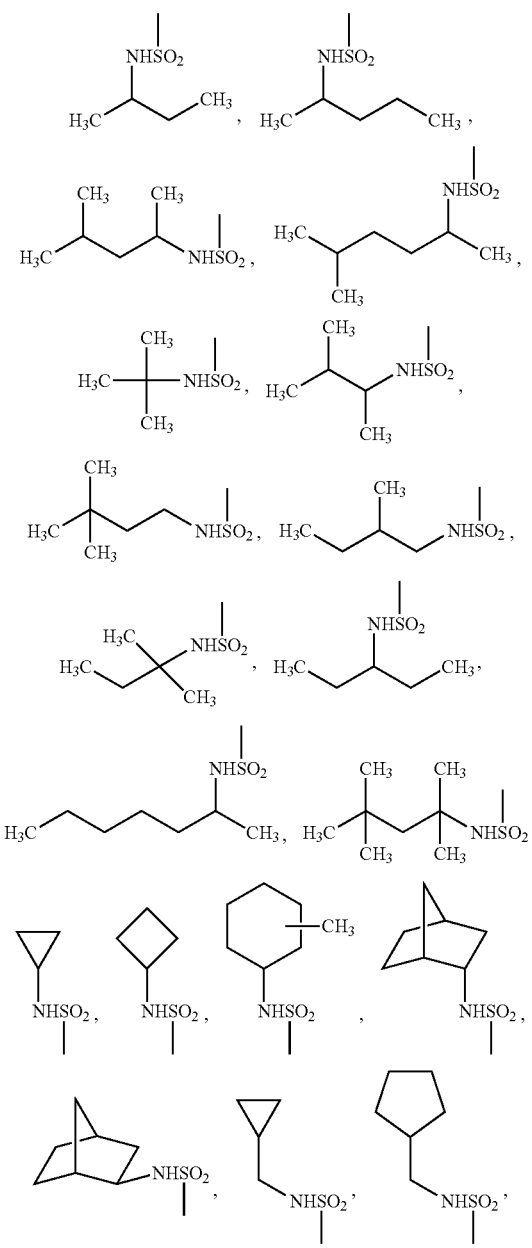
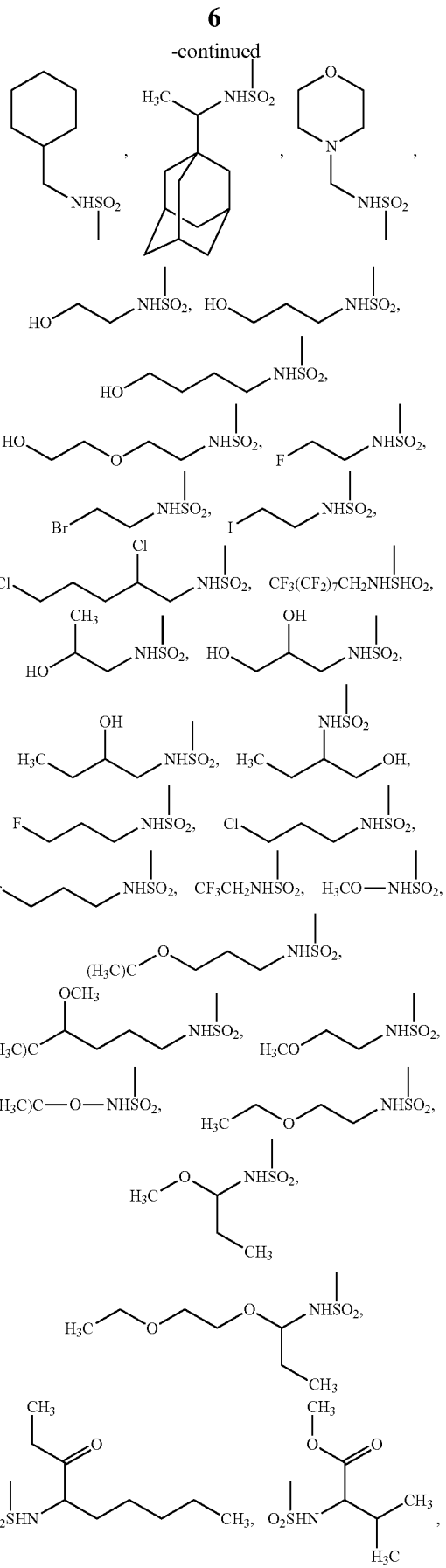

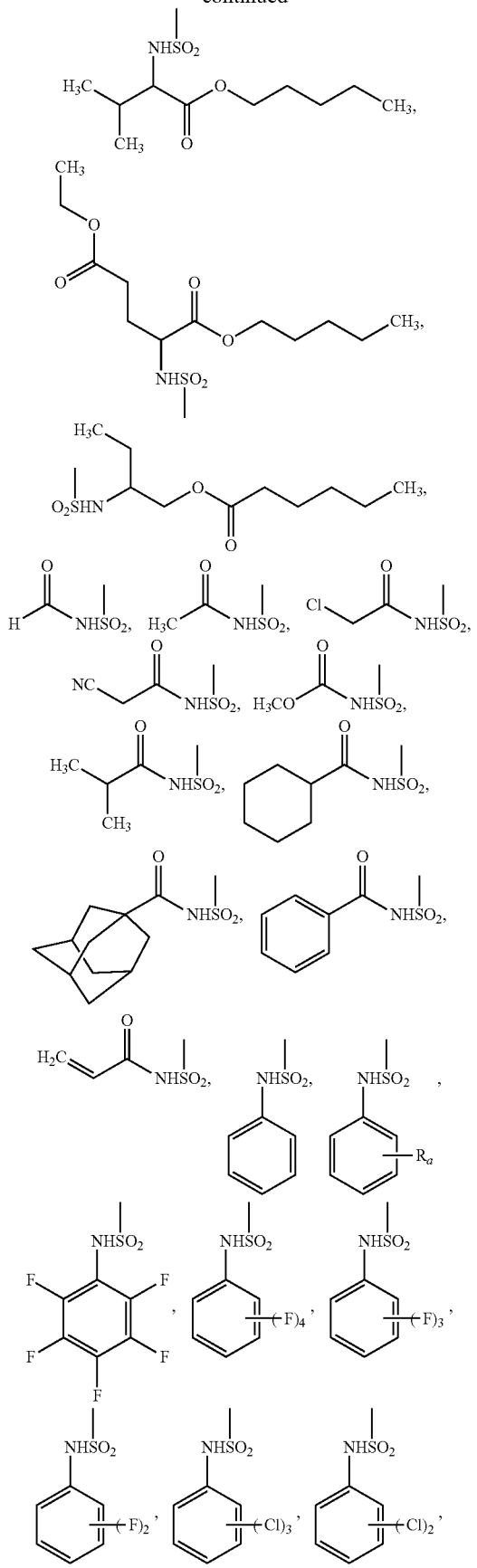
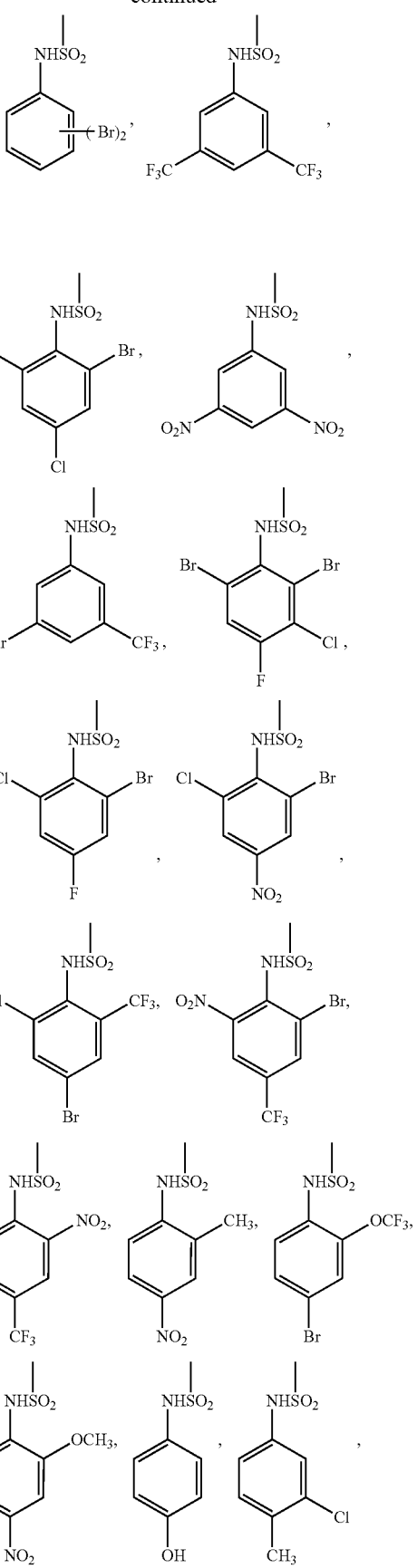

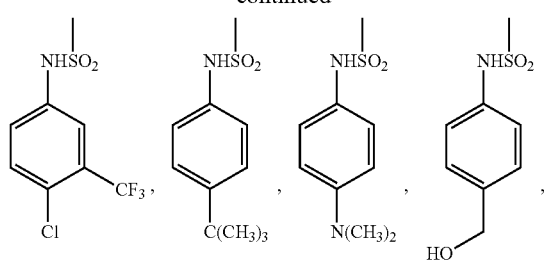
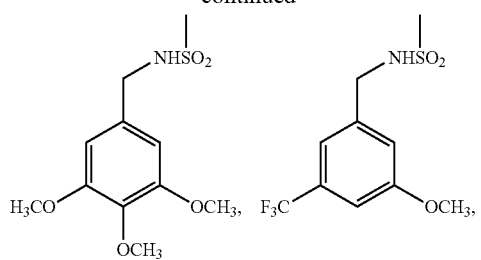
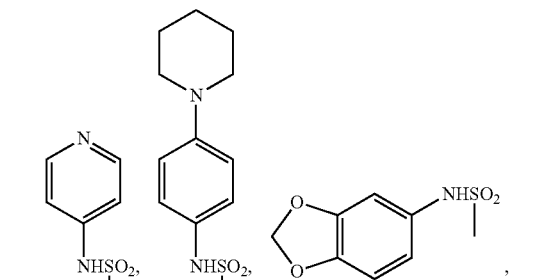
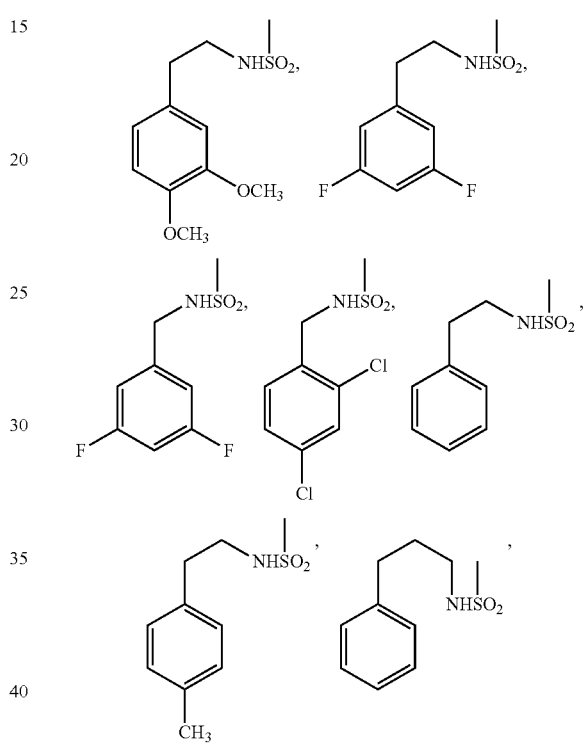
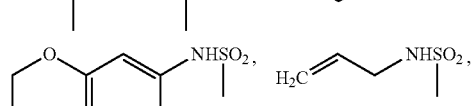
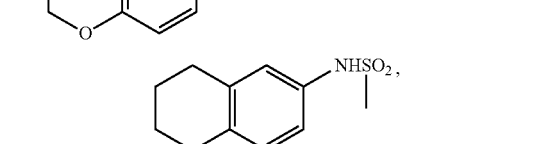
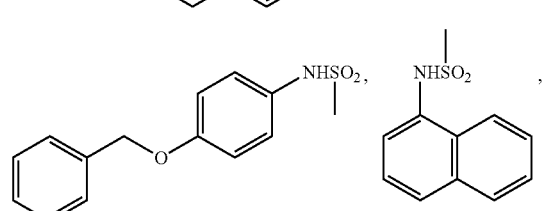
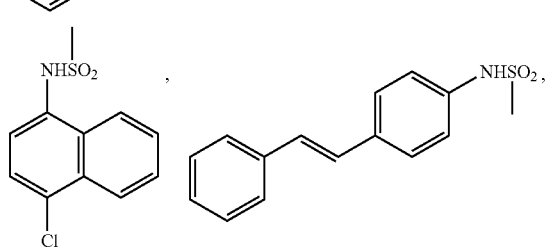
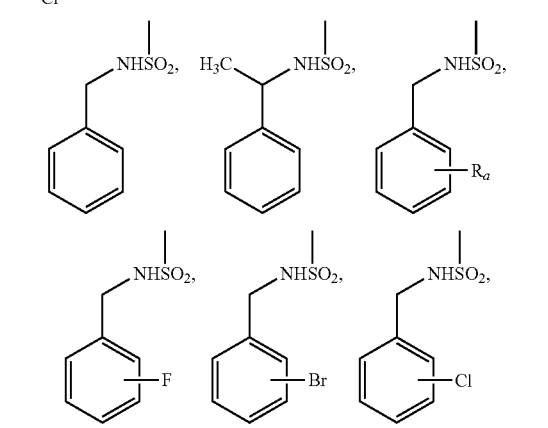

-continued
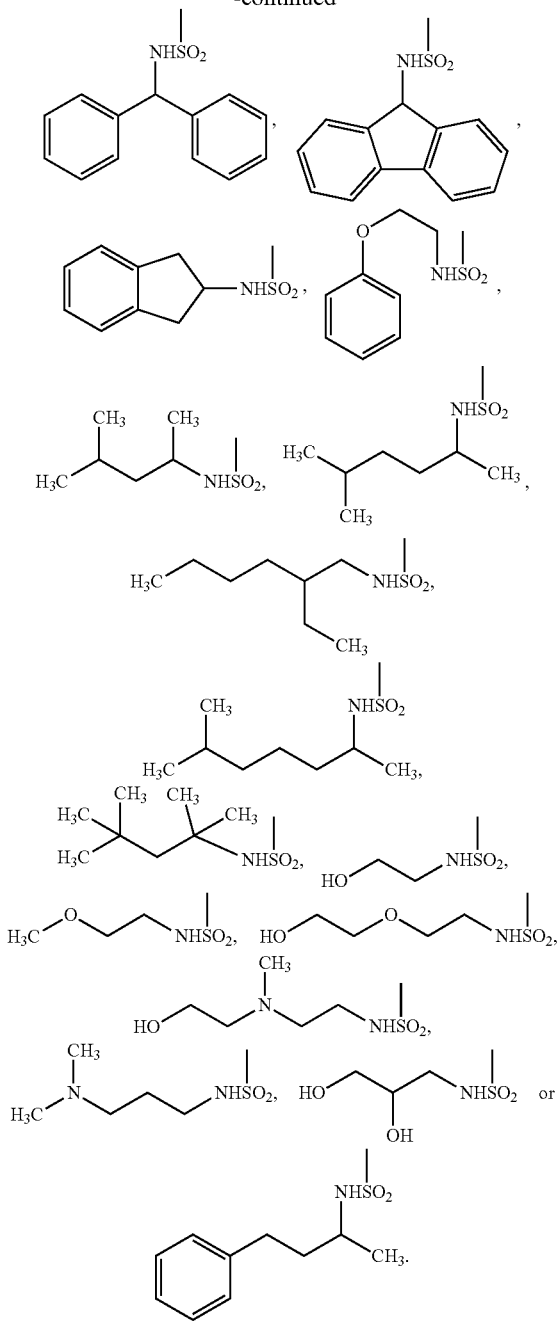
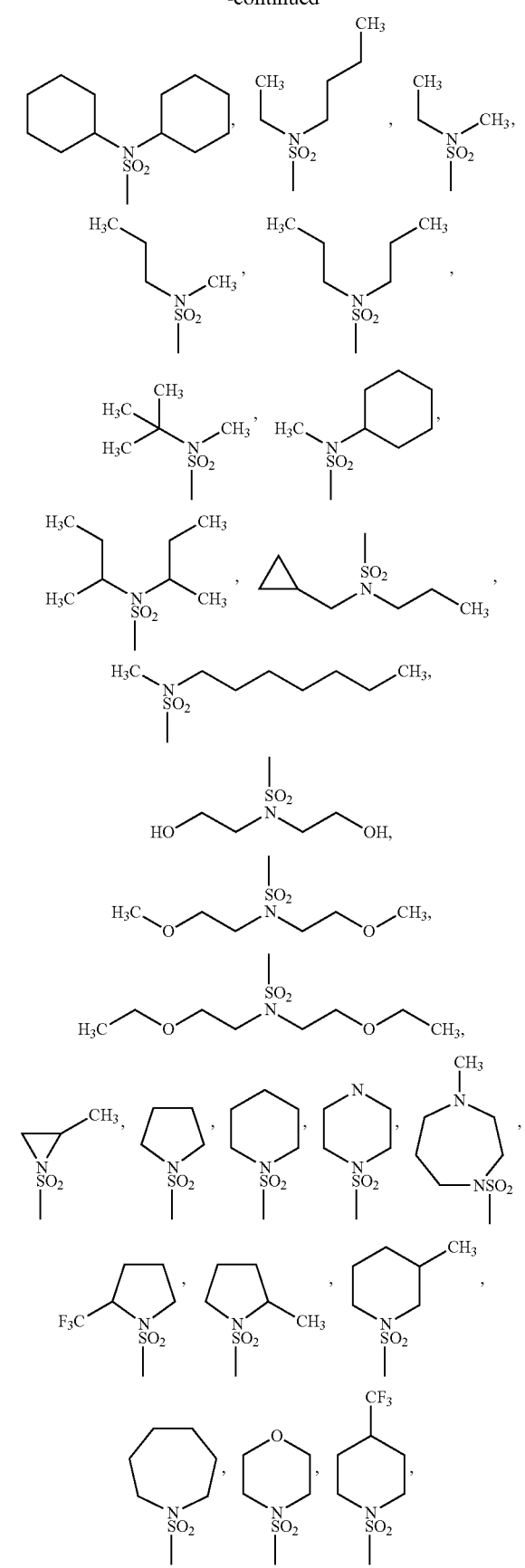
The aforementioned $R_a$ represents an alkyl group of 1 to 3 carbon atoms, an alkoxy group of 1 to 3 carbon atoms, the alkyl group of 1 to 3 carbon atoms substituted by a halogen atom, or the alkoxy group of 1 to 3 carbon atoms substituted by a halogen atom.
The aforementioned —$SO_2NR_8R_9$ can preferably be
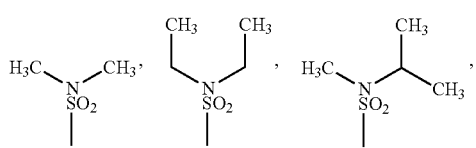

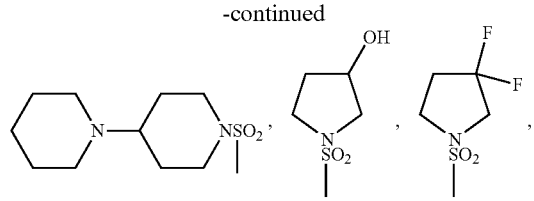
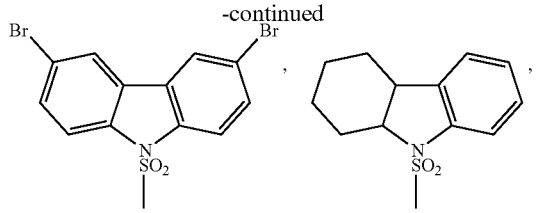
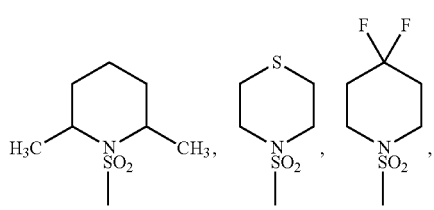
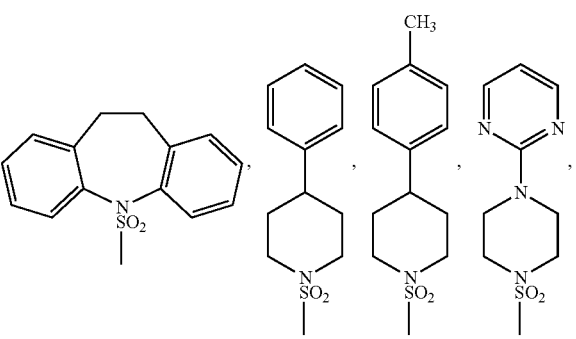
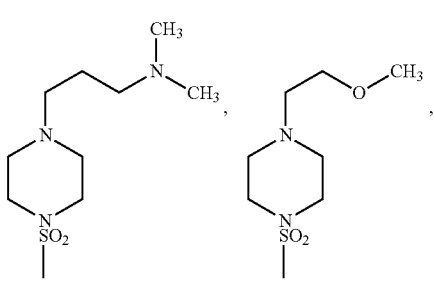
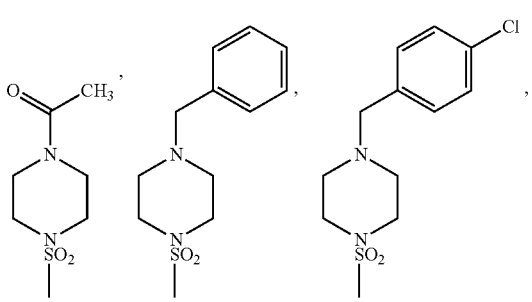
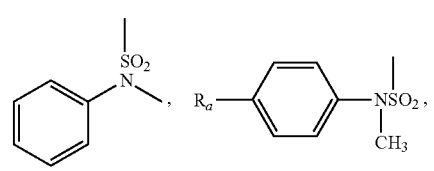
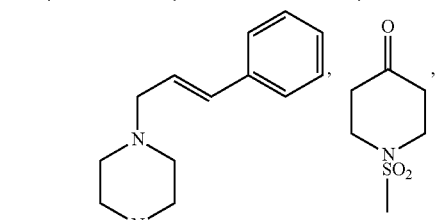
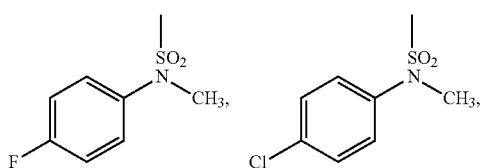
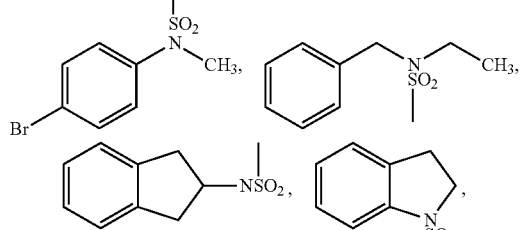
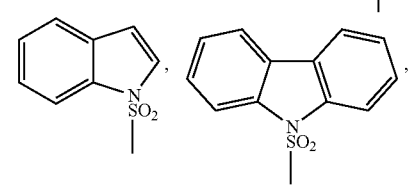
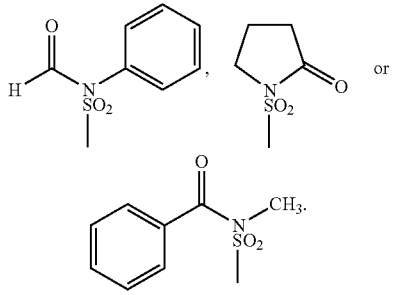
The $R_a$ is defined as above rather than being mentioned repetitively.

The dye (B) is preferably a red dye having a structure as the formula (I-1):

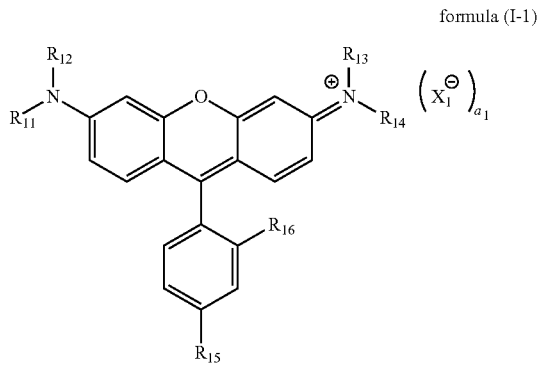

formula (I-1)

in the formula (I-1), the $R_{11}$ to the $R_{14}$ individually and independently represents a hydrogen atom, —$R_6$, an aromatic hydroxyl group having 6 to 10 carbon atoms or the aromatic hydroxyl group having 6 to 10 carbon atoms substituted by a halogen atom, —$R_6$, —OH, —$OR_6$, —$SO_3^-$, —$SO_3H$, —$SO_3Na$, —COOH, —$COOR_6$, —$SO_3R_6$, —$SO_2NHR_8$ or —$SO_2NR_8R_9$, in which the $R_6$ is defined as the aforementioned description; the $R_{15}$ represents a hydrogen atom, —$SO_3^-$, —$SO_3H$, —$SO_2NHR_8$ or —$SO_2NR_8R_9$, and the $R_{16}$ represents —$SO_3^-$, —$SO_3H$, —$SO_2NHR_8$ or —$SO_2NR_8R_9$, in which the $R_8$ and the $R_9$ are defined as the above-mentioned description; the $X_1$ represents a halogen atom; and the $a_1$ represents 0 or 1.

The dye (B) is preferably a red dye having a structure as the formula (I-2):

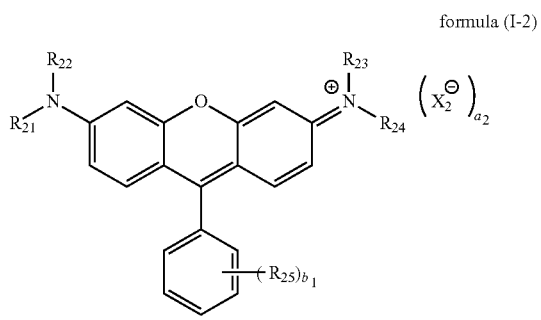

formula (I-2)

in the formula (I-2), the $R_{21}$ to the $R_{24}$ individually and independently represents a hydrogen atom, an aromatic hydroxyl group having 6 to 10 carbon atoms or the aromatic hydroxyl group having 6 to 10 carbon atoms substituted by a halogen atom, —$R_{26}$, —OH, —$OR_{26}$, —$SO_3^-$, —$SO_3H$, —$SO_3Na$, —COOH, —$COOR_{26}$, —$SO_3R_{26}$ or —$SO_2NHR_{28}$; the $R_{25}$ represents —$SO_3^-$, —$SO_3Na$, —COOH, —$COOR_{26}$, —$SO_3H$ or —$SO_2NHR_{28}$; the $b_1$ represents an integer of 0 to 5, and when the $b_1$ is 2 to 5, a plurality of the $R_{25}$ is the same or different from each other; the $X_2$ represents a halogen atom; and the $a_2$ represents 0 or 1.

The aforementioned $R_{26}$ represents the alkyl group of 1 to 10 carbon atoms, or the alkyl group of 1 to 10 carbon atoms substituted by the halogen atom or —$OR_{27}$, in which the $R_{27}$ represents the alkyl group of 1 to 10 carbon atoms.

The aforementioned $R_{28}$ represents a hydrogen atom, —$R_{26}$, —$COOR_{26}$, an aromatic hydrocarbon group of 6 to 10 carbon atoms, or the aromatic hydrocarbon group of 6 to 10 carbon atoms substituted by —$R_{26}$ or —$OR_{26}$.

The dye (B) is preferably a red dye having a structure as the formula (I-3):

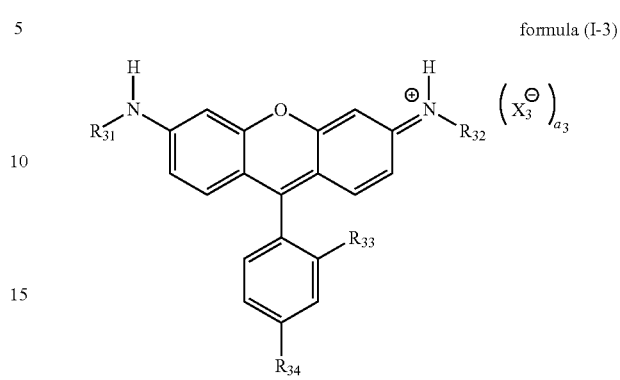

formula (I-3)

in the formula (I-3), the $R_{31}$ and the $R_{32}$ individually and independently represents a phenyl group or the phenyl group substituted by a halogen atom, —$R_{26}$, —$OR_{26}$, —$COOR_{26}$, —$SO_3R_{26}$ or —$SO_2NHR_{28}$; the $R_{33}$ represents —$SO_3^-$ or —$SO_2NHR_{26}$; the $R_{34}$ represents a hydrogen atom, —$SO_3^-$ or —$SO_2NHR_{28}$; the $X_3$ represents a halogen atom; and the $a_3$ represents 0 or 1.

The aforementioned $R_{26}$ represents the alkyl group of 1 to 10 carbon atoms, or the alkyl group of 1 to 10 carbon atoms substituted by a halogen atom or —$OR_{27}$, in which the $R_{27}$ represents the alkyl group of 1 to 10 carbon atoms.

The aforementioned $R_{28}$ represents a hydrogen atom, —$R_{26}$, —$COOR_{26}$, an aromatic hydrocarbon group of 6 to 10 carbon atoms or an aromatic hydrocarbon group of 6 to 10 carbon atoms substituted by —$R_{26}$ or —$OR_{26}$, in which $R_{26}$ is defined as the above-mentioned description rather than being mentioned repetitively.

The dye (B) is preferably a red dye having a structure as the formula (I-4):

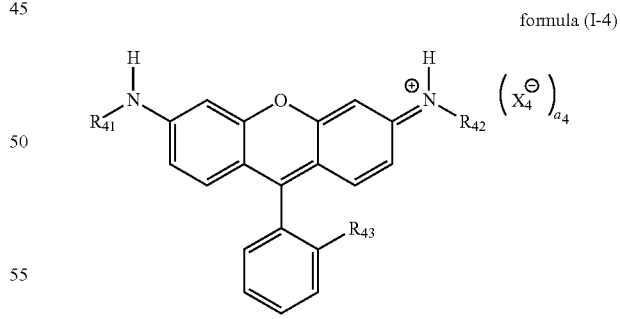

formula (I-4)

in the formula (I-4), the $R_{41}$ and the $R_{42}$ individually and independently represents a phenyl group or the phenyl group substituted by —$R_{26}$ or —$SO_2NHR_{28}$; the $R_{43}$ represents —$SO_3^-$ or —$SO_2NHR_{28}$; the $X_4$ represents a halogen atom; the $a_4$ represents 0 or 1; and the $R_{26}$ and the $R_{28}$ are defined as the above-mentioned description rather than being mentioned repetitively.

The example of dye (B) can include but be not limited to the formula (I-5) to the formula (I-35) as follows:

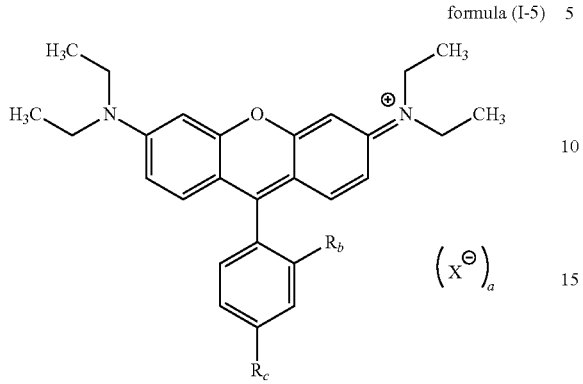

formula (I-5)

in the formula (I-5), the $R_b$ and the $R_c$ individually and independently represents a hydrogen atom, $—SO_3^-$, COOH or $—SO_2NHR_{81}$, in which the $R_{81}$ represents 2-ethylhexyl; and the X and the a are defined as above rather than being mentioned repetitively.

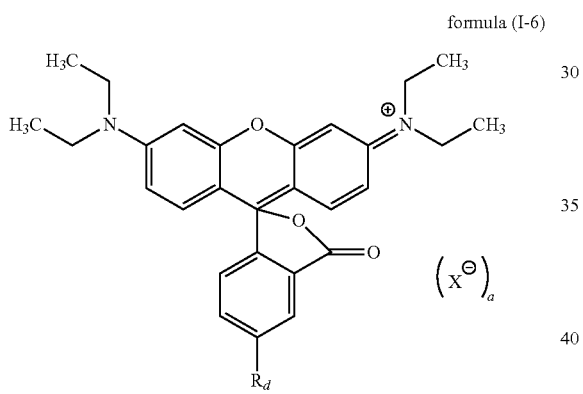

formula (I-6)

in the formula (I-6), the $R_d$ represents a hydrogen atom, $—SO_3^-$, COOH or $—SO_2NHR_{81}$, in which the $R_{81}$ represents 2-ethylhexyl; and the X and the a are defined as above rather than being mentioned repetitively.

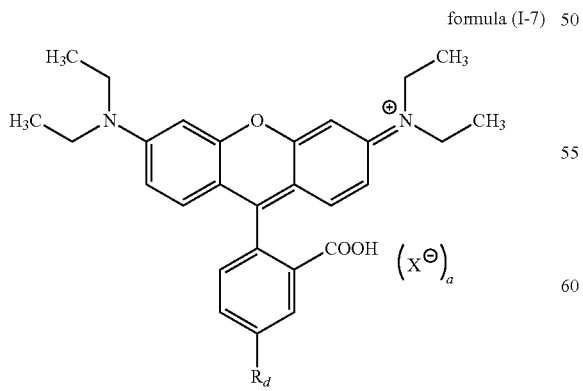

formula (I-7)

in the formula (I-7), the $R_d$ represents a hydrogen atom, $—SO_3^-$, COOH or $—SO_2NHR_{81}$, in which the $R_{81}$ represents 2-ethylhexyl; and the X and the a are defined as the above-mentioned description rather than being mentioned repetitively.

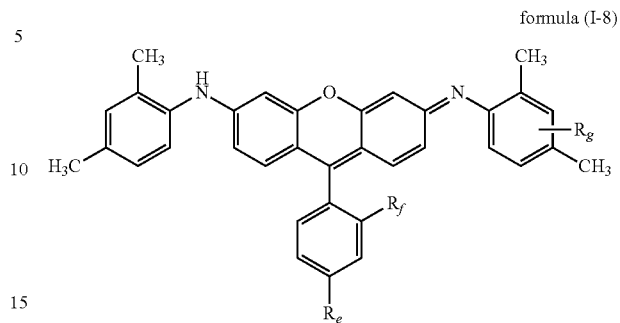

formula (I-8)

in the formula (I-8), the $R_e$, $R_f$ and $R_g$ individually and independently represents $—SO_3^-$, $—SO_3Na$ or $—SO_2NHR_{81}$, in which the $R_{81}$ represents 2-ethylhexyl group.

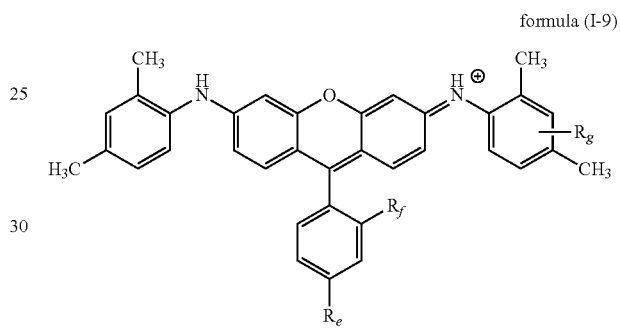

formula (I-9)

in the formula (I-9), the $R_e$, $R_f$, and $R_g$ individually and independently represents $—SO_3^-$, $—SO_3Na$ or $—SO_2NHR_{81}$, in which the $R_{81}$ represents 2-ethylhexyl group.

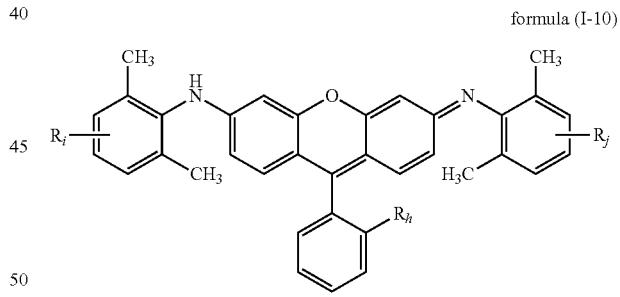

formula (I-10)

in the formula (I-10), the $R_h$, $R_i$, and $R_j$ individually and independently represents $—SO_3^-$, $—SO_3H$ or $—SO_2NHR_{81}$, in which the $R_{81}$ represents 2-ethylhexyl group.

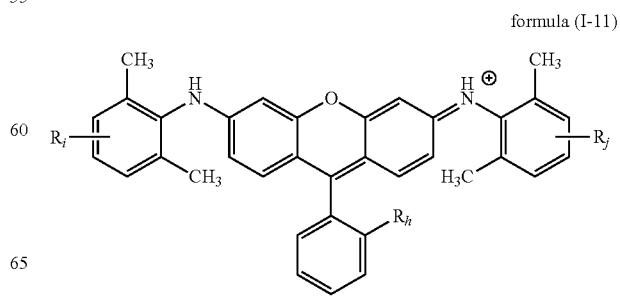

formula (I-11)

in the formula (I-11), the $R_h$, $R_i$, and $R_j$ individually and independently represents —$SO_3^-$, —$SO_3H$ or —$SO_2NHR_{81}$, in which the $R_{81}$ represents 2-ethylhexyl group.

formula (I-12)

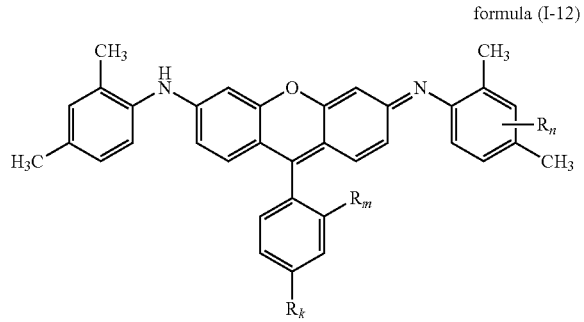

in the formula (I-12), the $R_k$, $R_m$ and $R_n$ individually and independently represents —$SO_3^-$, —$SO_3Na$ or —$SO_2NHR_{81}$, in which the $R_{81}$ represents 2-ethylhexyl group.

formula (I-13)

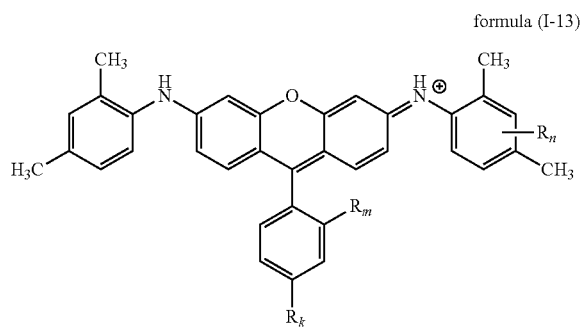

in the formula (I-13), the $R_k$, $R_m$, and $R_n$ individually and independently represents —$SO_3^-$, —$SO_3Na$ or —$SO_2NHR_{81}$, in which the $R_{81}$ represents 2-ethylhexyl group.

formula (I-14)

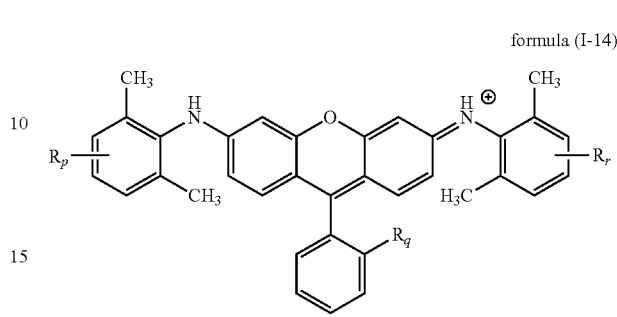

in the formula (I-14), the $R_p$, $R_q$, and $R_r$ individually and independently represents —$SO_3^-$, —$SO_3H$ or —$SO_2NHR_{81}$, in which the $R_{81}$ represents 2-ethylhexyl group.

formula (I-15)

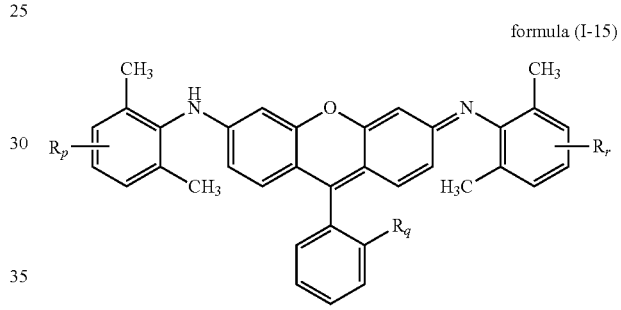

in the formula (I-15), the $R_p$, $R_q$, and $R_r$ individually and independently represents —$SO_3^-$, —$SO_3H$ or —$SO_2NHR_{81}$, in which the $R_{81}$ represents 2-ethylhexyl group.

formula (I-16)

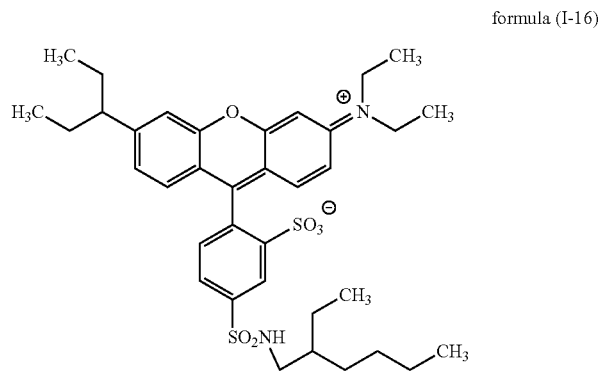

formula (I-17)

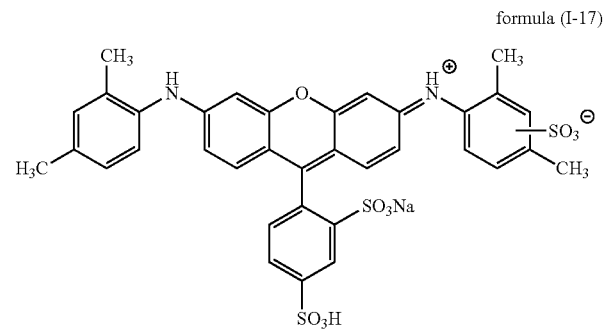

-continued
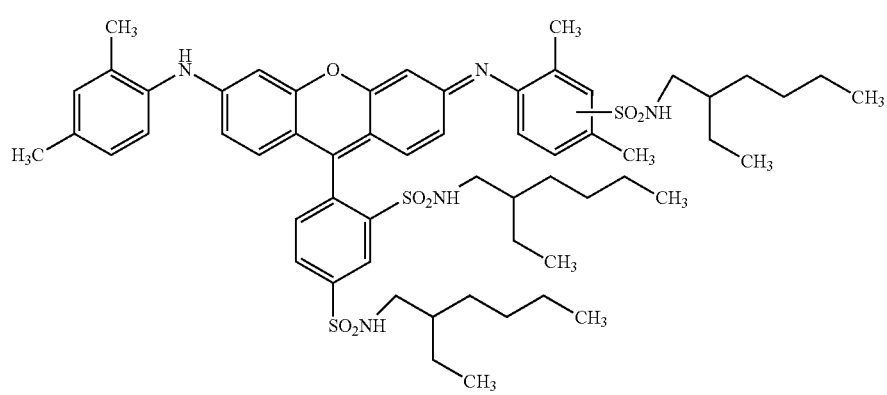
formula (I-18)
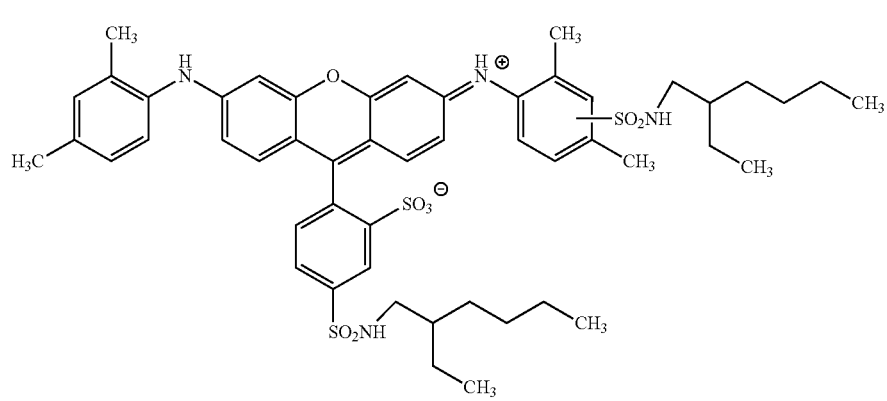
formula (I-19)
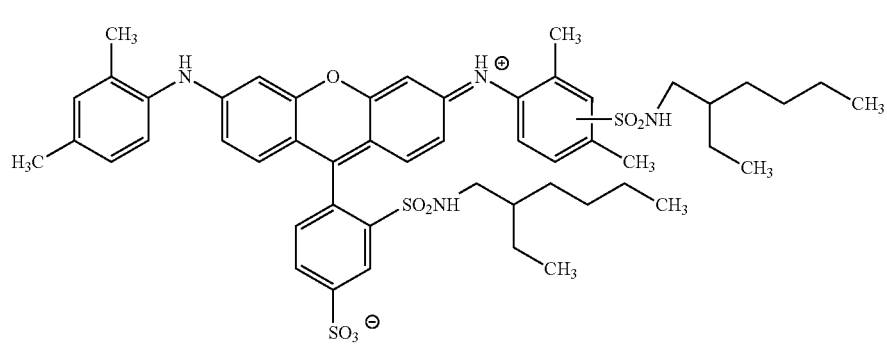
formula (I-20)
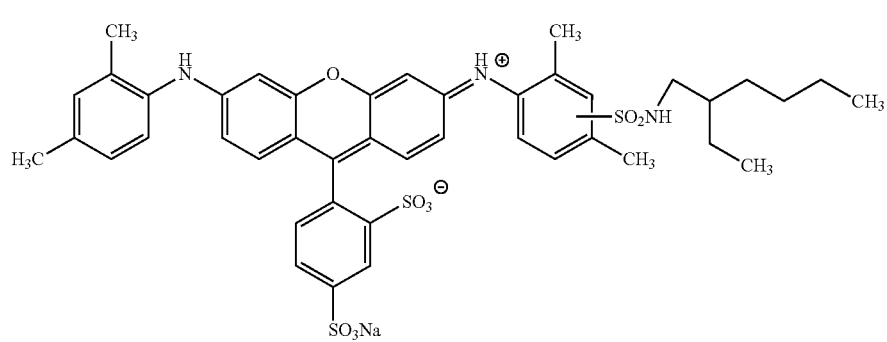
formula (I-21)

formula (I-22)
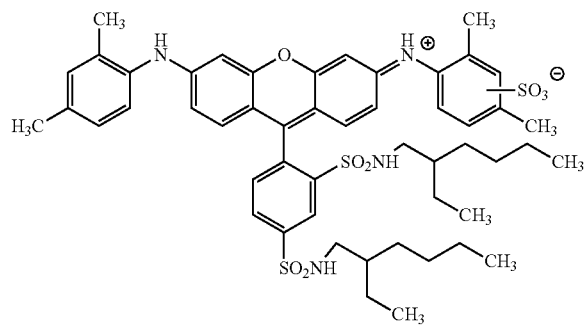
formula (I-23)
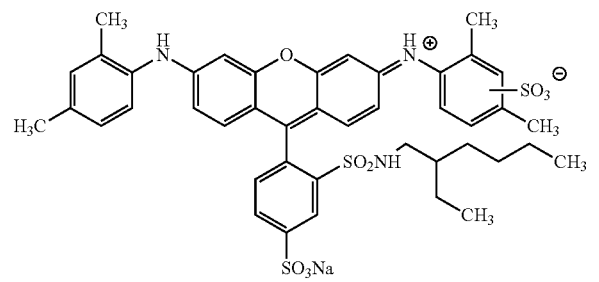
formula (I-24)
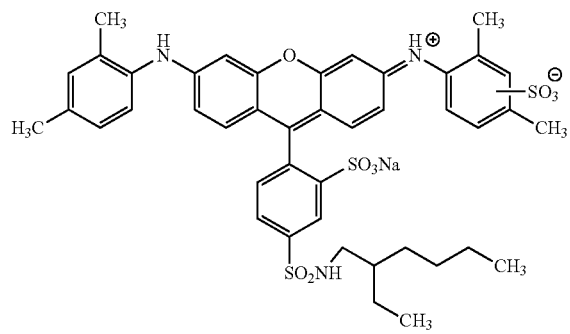
formula (I-25)
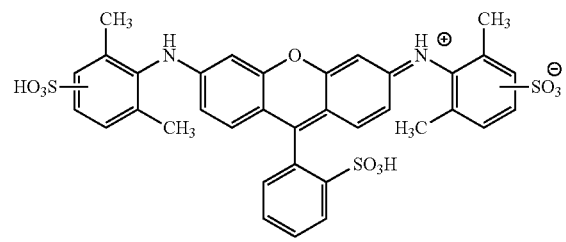
formula (I-26)
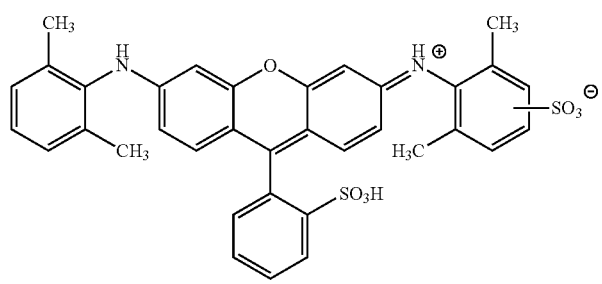
formula (I-27)
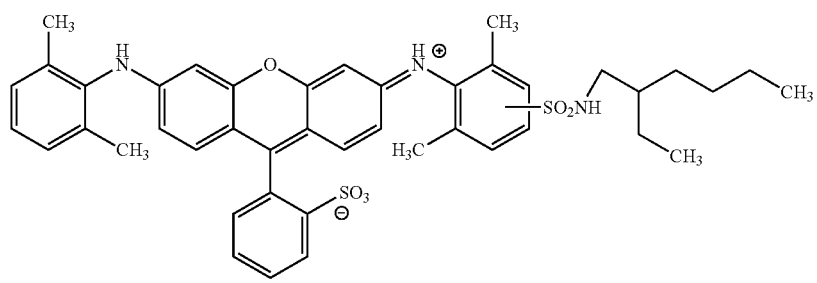
formula (I-28)
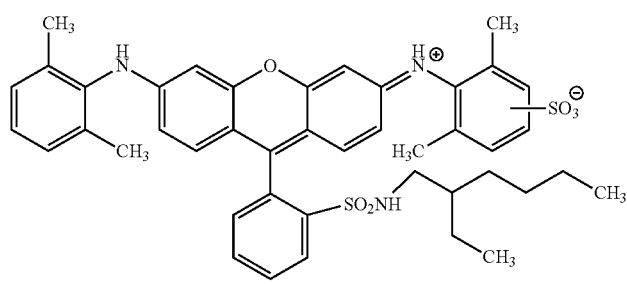

-continued
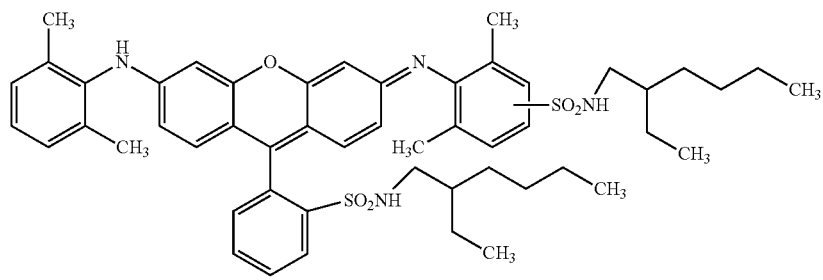
formula (I-29)
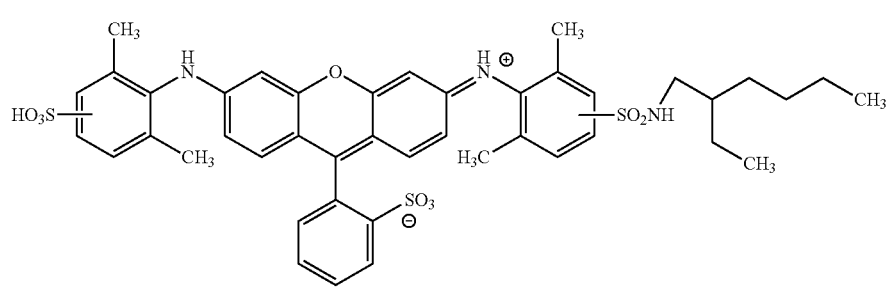
formula (I-30)
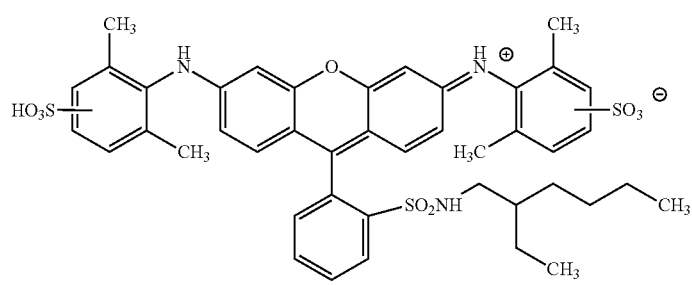
formula (I-31)
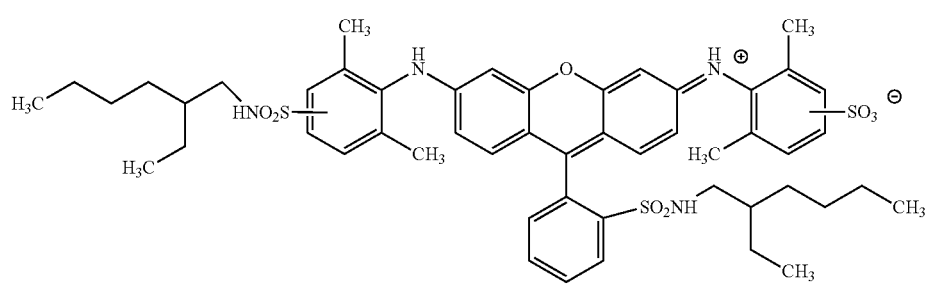
formula (I-32)
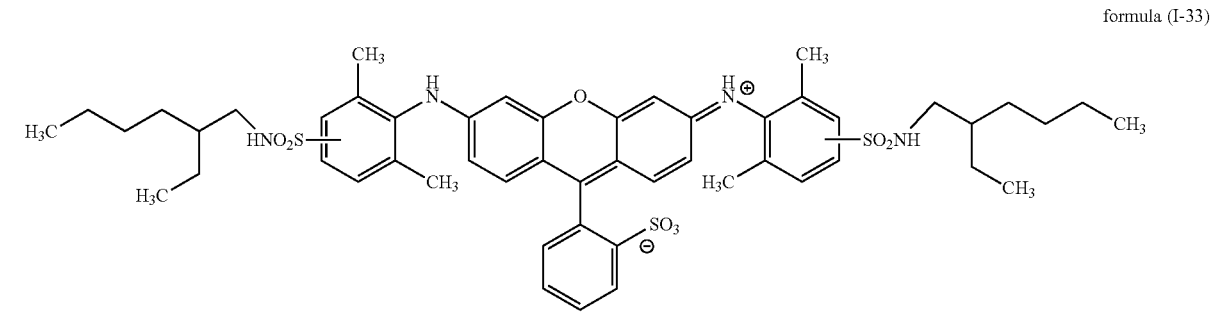
formula (I-33)

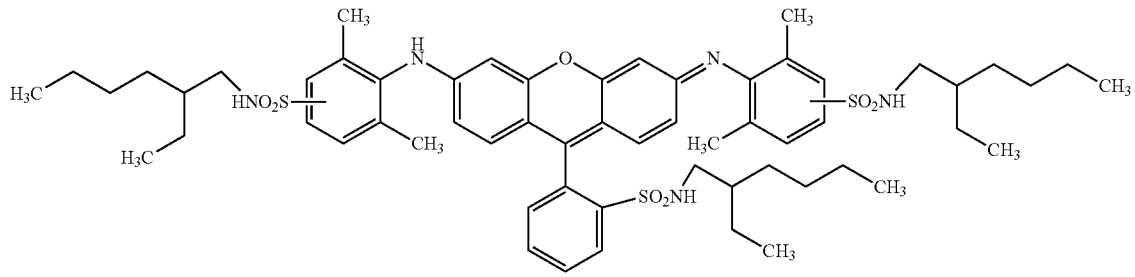

formula (I-34)

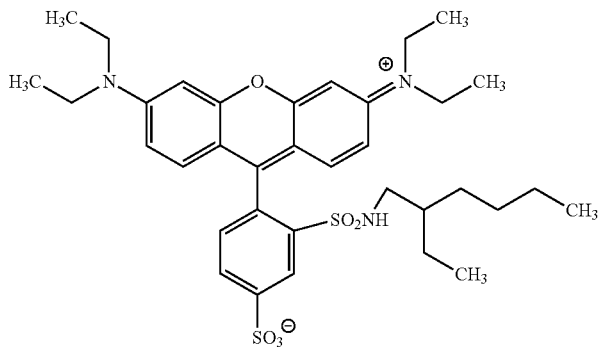

formula (I-35)

The dye (B) can preferably be the compound having the structure as the formula (I-5) (in which the $R_b$ and the $R_c$ are respectively —$SO_3^-$, and the a is 0; C.I. acidic red dye 52), the compound having the structure as the formula (I-26) (C.I. acidic red dye 289), the compound having the structure as the formula (I-32) or the formula (I-35), or any combination thereof.

Based on the total amount of the alkali-soluble resin (C) as 100 parts by weight, the amount of the dye (B) is 5 parts by weight to 50 parts by weight, preferably 6 parts by weight to 45 parts by weight, and more preferably 7 parts by weight to 40 parts by weight.

If the blue photosensitive resin composition of the present invention has no dye (B), the resulted color filter will have a poor contrast ratio.

Alkali-Soluble Resin (C)

The alkali-soluble resin (C) can comprise a first alkali-soluble resin (C-1) having a hindered-amine structure.

First Alkali-Soluble Resin (C-1)

The first alkali-soluble resin (C-1) is copolymerized by an ethylenically monomer having a hindered-amine structure (c1), an ethylenically unsaturated monomer having one or more carboxyl groups (c2) and an other copolymerizable ethylenically unsaturated monomer (c3) except from the ethylenically monomer having the hindered-amine structure (c1) and the ethylenically unsaturated monomer having one or more carboxyl groups (c2).

Ethylenically Monomer Having Hindered-Amine Structure (c1)

The ethylenically monomer having the hindered-amine structure (c1) can be the one as the formula (II):

formula (II)

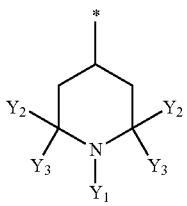

in the formula (II), the $Y_1$ represents a hydrogen atom, a linear-, branched- or cyclo-alkyl group of 1 to 18 carbon atoms, an aromatic group of 6 to 20 carbon atoms, an aromatic alkyl group, an acyl group, an oxygen free radical or —$OY_4$ of 7 to 12 carbon atoms; the $Y_4$ represents a hydrogen atom, a linear-, branched- or cyclo-alkyl group of 1 to 18 carbon atoms, an aromatic group of 6 to 20 carbon atoms, or an aromatic alkyl group of 7 to 12 carbon atoms; the $Y_2$ and the $Y_3$ individually and independently represents methyl, ethyl, phenyl or aliphatic ring bound by 4 to 12 carbon atoms; and the symbol* represents a covalent bond.

When the $Y_1$ and the $Y_4$ represents the linear-, branched- or cyclo-alkyl group of 1 to 18 carbon atoms, the $Y_1$ and the $Y_4$ can be a linear or a branched alkyl group of 1 to 18 carbon atoms or cycloalkyl group of 3 to 8 carbon atoms, for example: methyl, ethyl, n-propyl, isopropyl, n-butyl, t-butyl, n-hexyl, cyclohexyl, n-octyl, or, cetyl and the like. When the $Y_1$ represents an aromatic group of 6 to 20 carbon atoms, the Examples can be phenyl group, α-naphthyl or β-naphthyl. When the $Y_1$ and the $Y_4$ represents the aromatic alkyl group of 7 to 12 carbon atoms, the $Y_1$ and the $Y_4$ can be the aromatic group bound with the alkyl group of 1 to 8 carbon atoms, and carbon atoms of the aromatic group is 6 to 10, the Examples can be benzyl group, ethylbenzene group, α-methyl benzyl group, or 2-phenyl propane-2-yl. When the $Y_1$ and the $Y_4$ represents the acyl group, the alkyl acyl group or the aromatic acyl group of 2 to 8 carbon atoms, the examples of the $Y_1$ and the $Y_4$ can be an acetyl or a benzoyl group.

The $Y_1$ of the present invention can preferably be a hydrogen atom, an alkyl group of 1 to 5 carbon atoms or an oxygen free radical, in which the hydrogen atom, oxygen free radical and methyl group is more preferable.

Moreover, the $Y_2$ and the $Y_3$ in the formula (II) can bind to form a structure of aliphatic ring, the Examples can be cyclopentane or cyclohexane and the like. The $Y_2$ and the $Y_3$ can preferably be a methyl group.

The ethylenically monomer having the hindered-amine structure as the formula (II) can be a compound of the structure in the formula (II-1) and the formula (II-2):

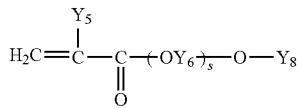

formula (II-1)

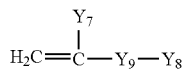

formula (II-2)

in the formula (II-1) and (II-2), the $Y_5$ and the $Y_7$ independently and individually represents a hydrogen atom or a methyl group; the $Y_6$ represents a methylene or alkylmethylene of 2 to 5 carbon atoms; the $Y_8$ represents the structure as the formula (II); the $Y_9$ represents —CONH—*, —SO$_2$—, —SO$_2$NH—*, in which the *represents a covalent bond bound with the $Y_8$; the $Y_6$ is preferably ethylene or propylene, and more preferably ethylene; and the s is an integer of 0 to 8, and more preferably 0 to 6.

The Examples of the ethylenically monomer having the hindered-amine structure (c1) as the formula (II-1) can be the structures in the following formula (II-1-1) to (II-1-7):

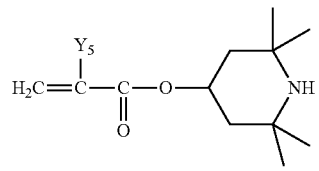

formula (II-1-1)

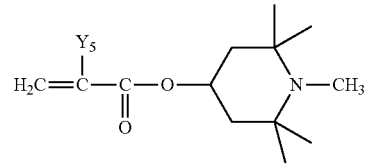

formula (II-1-2)

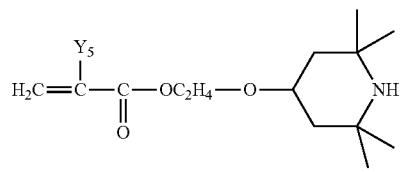

formula (II-1-3)

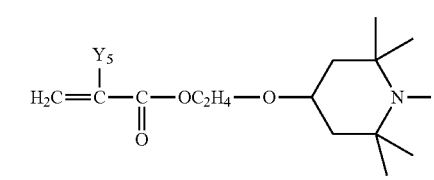

formula (II-1-4)

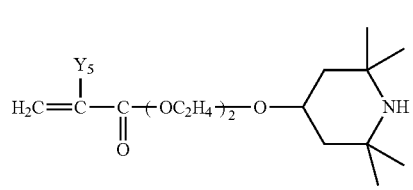

formula (II-1-5)

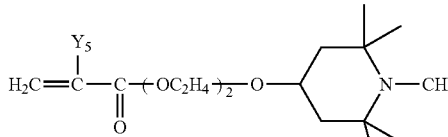

formula (II-1-6)

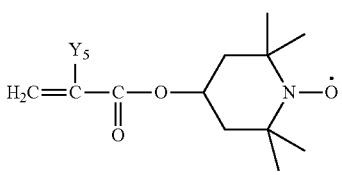

formula (II-1-7)

in the formulas (II-1-1) to (II-1-7), the $Y_5$ is defined as the above-mentioned description rather than being mentioned repetitively.

The Examples of the ethylenically monomer having the hindered-amine structure as the formula (II-2) can be the structures in the following formulas (II-2-1) to (II-2-4):

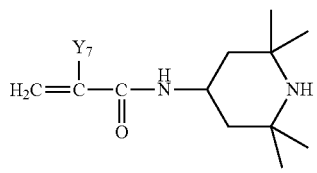

formula (II-2-1)

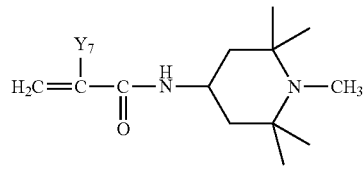

formula (II-2-2)

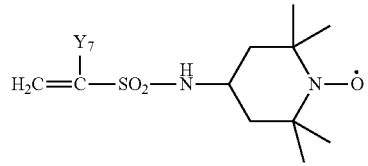

formula (II-2-3)

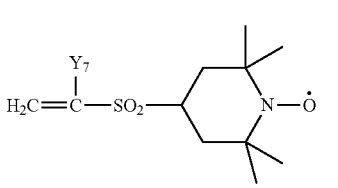

formula (II-2-4)

in the formulas (II-2-1) to (II-2-4), the $Y_7$ is defined as above rather than being mentioned repetitively.

The ethylenically monomer having the hindered-amine structure (c1) of the present invention can be 4-methacrylamido-2,2,6,6-tetramethylpiperidine or the products made by Hitachi Co. Ltd. such as the trade name of FA-712HM [2,2,6,6-tetramethylpiperidine methacrylate as the formula (II-1-1), and the $Y_5$ represents a methyl group] or the trade name of FA-711MM [1,2,2,6,6-pentamethylpiperidyl methacrylate as the formula (II-1-2), and the $Y_5$ represents a methyl group].

The above-mentioned ethylenically Monomer (c1) having the hindered-amine structure can be used alone or in a combination of two or more.

Based on the total amount of the above-mentioned ethylenically monomer having the hindered-amine structure (c1), a following ethylenically unsaturated monomer having one or more carboxyl groups (c2) and an other copolymerizable ethylenically unsaturated monomer (c3) as 100 parts by weight, an amount of the ethylenically monomer having the hindered-amine structure (c1) is 3 parts by weight to 45 parts by weight, preferably 4 parts by weight to 40 parts by weight, and more preferably 5 parts by weight to 35 parts by weight.

Ethylenically Unsaturated Monomer Having One or More Carboxyl Groups (c2)

The ethylenically unsaturated monomer having one or more carboxyl groups (c2) can include but be not limited to a unsaturated monocarboxylic compound such as acrylic acid, methacrylic acid, butenic acid, α-chloro acrylic acid, ethyl acrylic acid, benzalacetic acid, 2-acryloyloxyethylsuccinate monoester, 2-methacryloyloxyethyl succinate monoester or the like; a unsaturated dicarboxylic acid (anhydride) compound such as maleic acid, maleic anhydride, fumaric acid, itaconic acid, itaconic anhydride, citraconic acid, citraconic anhydride and the like; and a unsaturated polycarboxylic acid (anhydride) compound having more than three carboxyl groups. The above-mentioned ethylenically unsaturated monomer having one or more carboxyl groups (c2) can be used alone or in a combination of two or more.

Preferably, the ethylenically unsaturated monomer having one or more carboxyl groups (c2) is selected from the group consisting of acrylic acid, methacrylic acid, 2-acryloyloxyethyl succinate monoester or 2-methacryloyloxyethyl succinate monoester, in which the 2-acryloyloxyethyl succinate monoester or the 2-methacryloyloxyethyl succinate monoester is more preferable.

Based on the total amount of the above-mentioned ethylenically monomer having the hindered-amine structure (c1), the ethylenically unsaturated monomer having one or more carboxyl groups (c2) and the following copolymerizable ethylenically unsaturated monomer (c3) as 100 parts by weight, an amount of the ethylenically monomer having one or more carboxyl groups (c2) is 15 parts by weight to 55 parts by weight, preferably 20 parts by weight to 50 parts by weight, and more preferably 25 parts by weight to 45 parts by weight.

Other Copolymerizable Ethylenically Unsaturated Monomer (c3)

The other copolymerizable ethylenically unsaturated monomer (c3) except from the ethylenically monomer having the hindered-amine structure (c1) and the ethylenically monomer having one or more carboxyl groups (c2) can include but not be limited to aromatic ethylenically compounds such as styrene (SM), α-methylstyrene, vinyl toluene, p-chlorostyrene, methoxystyrene and the like; maleimide compounds such as N-phenylmaleimide (PMI), N-o-hydroxyphenylmaleimide, N-m-hydroxyphenylmaleimide, N-p-hydroxyphenylmaleimide, N-o-methylphenylmaleimide, N-m-methylphenylmaleimide, N-p-methylphenylmaleimide, N-o-methoxyphenylmaleimide, N-m-methoxyphenylmaleimide, N-p-methoxyphenylmaleimide, N-cyclohexylmaleimide and the like; unsaturated carboxylic acid ester compounds such as methyl acrylate (MA), methyl methacrylate, ethyl acrylate, ethyl methacrylate, n-propyl acrylate, n-propyl methacrylate, isopropyl acrylate, isopropyl methacrylate, n-butyl acrylate, n-butyl methacrylate, isobutyl acrylate, isobutyl methacrylate, sec-butyl acrylate, sec-butyl methacrylate, tert-butyl acrylate, tert-butyl methacrylate, 2-hydroxyethyl acrylate, 2-hydroxyethyl methacrylate, 2-hydroxypropyl acrylate, 2-hydroxypropyl methacrylate, 3-hydroxypropyl acrylate, 3-hydroxypropyl methacrylate, 2-hydroxybutyl acrylate, 2-hydroxybutyl methacrylate, 3-hydroxybutyl acrylate, 3-hydroxybutyl methacrylate, 4-hydroxybutyl acrylate, 4-hydroxybutyl methacrylate, propylene acrylate, propylene methacrylate, benzyl acrylate, benzyl methacrylate (BzMA), phenyl acrylate, phenyl methacrylate, methoxy triethylene glycol acrylate, methoxy triethylene glycol methacrylate, dodecyl methacrylate, tetradecyl methacrylate, hexadecyl methacrylate, octadecyl methacrylate, eicosyl methacrylate, docosanyl methacrylate, dicyclopentenyloxyethyl acrylate (DCPOA) and the like; N,N-dimethyl amino ethyl acrylate, N,N-dimethyl amino ethyl methacrylate, N,N-diethyl amino propyl acrylate, N,N-dimethyl amino propyl methacrylate, N,N-dibutyl amino propyl acrylate and N-isobutyl amino ethyl methacrylate; unsaturated carboxylic epoxypropyl ester compounds such as epoxypropyl acrylate, epoxypropyl methacrylate and the like; vinyl carboxylate compounds such as vinyl acetate, vinyl pivalate, vinyl butanoate and the like; unsaturated ether compounds such as methoxyethene, ethoxyethene, allyl epoxypropyl ether, methallyl epoxypropyl ether and the like; vinyl nitrile compounds such as acrylonitrile, methacrylonitrile, α-chloro acrylonitrile, vinylidene cyanide and the like; unsaturated amide compounds such as acrylamide, methacrylamide, α-chloro acrylamide, N-hydroxyethyl acrylamide, N-hydroxyethyl methacrylamide and the like; and aliphatic conjugated diene compounds such as 1,3-butadiene, isoprene, chlorinated butadiene and the like. The aforementioned other copolymerizable ethylenically unsaturated monomer (c3) can be used alone or in a combination of two or more.

Preferably, the other copolymerizable ethylenically unsaturated monomer is selected from styrene, N-phenylmaleimide, methacrylate, methyl methacrylate, 2-hydroxyethyl acrylate, 2-hydroxyethyl methacrylate, benzyl acrylate, benzyl methacrylate, dicyclopentenyloxyethyl acrylate or in any combination thereof.

Based on the total amount of the above-mentioned ethylenically monomer having the hindered-amine structure (c1), the ethylenically unsaturated monomer having one or more carboxyl groups (c2) and the other copolymerizable ethylenically unsaturated monomer (c3) as 100 parts by weight, an amount of the other copolymerizable ethylenically unsaturated monomer (c3) is 0 part by weight to 82 parts by weight, preferably 10 parts by weight to 70 parts by weight, and more preferably 20 parts by weight to 60 parts by weight.

If the blue photosensitive resin of the present invention has no the first alkali-soluble resin (C-1), the produced color filter will have an issue of very low voltage holding ratio.

Based on the total amount of the alkali-soluble resin (C) as 100 parts by weight, an amount of the first alkali-soluble resin (C-1) is 30 parts by weight to 100 parts by weight, preferably 40 parts by weight to 90 parts by weight, and more preferably 50 parts by weight to 80 parts by weight.

Second Alkali-Soluble Resin (C-2)

The alkali-soluble resin (C) of the present invention can optionally include the second alkali-soluble resin (C-2).

The second alkali-soluble resin (C-2) is copolymerized via the aforementioned ethylenically unsaturated monomer having one or more carboxylic acid groups (c2) and the other copolymerizable ethylenically unsaturated monomer (c3) except from the ethylenically monomer having the hindered-amine structure (c1) and the ethylenically unsaturated monomer having one or more carboxylic acid groups (c2), in which the ethylenically unsaturated monomer having one or more carboxylic acid groups (c2) and the other copolymerizable ethylenically unsaturated monomer (c3) are described as aforementioned rather than being mentioned repetitively.

Based on the total amount of the alkali-soluble resin (C) as 100 parts by weight, an amount of the second alkali-soluble resin (C-2) is 0 part by weight to 70 parts by weight, preferably 10 parts by weight to 60 parts by weight, and more preferably 20 parts by weight to 50 parts by weight.

Compound Having Ethylenically Unsaturated Group (D)

The compound having the ethylenically unsaturated group (D) denotes a unsaturated compound having at least one ethylenically unsaturated group or the unsaturated compound having two or more ethylenically unsaturated groups.

The unsaturated compound having at least one ethylenically unsaturated group can include but be not limited to acrylamide, acryloyl morpholine, methacryloyl morpholine, 7-amino-3,7-dimethyloctyl acrylate, 7-amino-3,7-dimethyloctyl methacrylate, isobutoxy methyl acrylamide, isobutoxy methyl methacrylamide, isobornyl ethoxy acrylate, isobornyl ethoxy methacrylate, isobornyl acrylate, isobornyl methacrylate, 2-ethylhexyl acrylate, 2-ethylhexyl methacrylate, ethyl diethylene glycol acrylate, ethyl diethylene glycol methacrylate, tert-octyl acrylamide, tert-octyl methacrylamide, diacetone acrylamide, diacetone methacrylamide, dimethylamino acrylate, dimethylamino methacrylate, dodecyl acrylate, dodecyl methacrylate, dicyclopentenyl ethoxy acrylate, dicyclopentenyl ethoxy methacrylate, dicyclopentenyl acrylate, dicyclopentenyl methacrylate, N,N-dimethyl acrylamide, N,N-dimethyl methacrylamide, tetrachlorophenyl acrylate, tetrachlorophenyl methacrylate, 2-tetrachlorophenoxy ethyl acrylate, 2-tetrachlorophenoxy ethyl methacrylate, tetrahydrofurfuryl acrylate, tetrahydrofurfuryl methacrylate, tetrabromophenyl acrylate, tetrabromophenyl methacrylate, 2-tetrabromophenoxyethyl acrylate, 2-tetrabromophenoxyethyl methacrylate, 2-trichlorophenoxyethyl acrylate, 2-trichlorophenoxyethyl methacrylate, tribromophenyl acrylate, tribromophenyl methacrylate, 2-tribromophenoxyethyl acrylate, 2-tribromophenoxyethyl methacrylate, 2-hydroxyethyl acrylate, 2-hydroxyethyl methacrylate, 2-hydroxypropyl acrylate, 2-hydroxypropyl methacrylate, vinyl caprolactam, N-vinyl pyrrolidone, ethyl phenoxy acrylate, ethyl phenoxy methacrylate, pentachlorophenyl acrylate, pentachlorophenyl methacrylate, pentabromophenyl acrylate, pentabromophenyl methacrylate, polyethylene glycol monoacrylate, polyethylene glycol monomethacrylate, polypropylene glycol monoacrylate, polypropylene glycol monomethacrylate, bornyl acrylate or bornyl methacrylate and the like.

The aforementioned unsaturated compound having at least one ethylenically unsaturated group can be used alone or in a combination of two or more.

The unsaturated compound having two or more ethylenically unsaturated groups includes but is not limited to ethylene glycol diacrylate, ethylene glycol dimethacrylate, dicyclopentyl diacrylate, dicyclopentyl dimethacrylate, triethylene glycol diacrylate, tetraethylene glycol diacrylate, tetraethylene glycol dimethacrylate, tri(2-hydroxyethyl)isocyanate diacrylate, tri(2-hydroxyethyl)isocyanate dimethacrylate, tri(2-hydroxyethyl)isocyanate triacrylate, tri (2-hydroxyethyl)isocyanate trimethacrylate, caprolactone-modified tri(2-hydroxyethyl)isocyanate triacrylate, caprolactone-modified tri(2-hydroxyethyl)isocyanate trimethacrylate, trihydroxymethylpropyl triacrylate, trihydroxymethylpropyl trimethacrylate, ethylene oxide (hereinafter as EO)-modified trihydroxymethylpropyl triacrylate, EO-modified trihydroxymethylpropyl trimethacrylate, propylene oxide (hereinafter as PO)-modified trihydroxymethylpropyl triacrylate, PO-modified trihydroxymethylpropyl trimethacrylate, triethylene glycol dimethacrylate, neopentylene glycol diacrylate, neopentylene glycol dimethacrylate, 1,4-butylene glycol diacrylate, 1,4-butylene glycol dimethacrylate, 1,6-hexylene glycol diacrylate, 1,6-hexylene glycol dimethacrylate, pentaerythritol triacrylate, pentaerythritol trimethacrylate, pentaerythritol tetraacrylate, pentaerythritol tetramethacrylate, polyester diacrylate, polyester dimethacrylate, polyethylene glycol diacrylate, polyethylene glycol dimethacrylate, dipentaerythritol hexaacrylate (DPHA), dipentaerythritol hexamethacrylate, dipentaerythritol pentaacrylate, dipentaerythritol pentamethacrylate, dipentaerythritol tetraacrylate, dipentaerythritol tetramethacrylate, caprolactone-modified dipentaerythritol hexaacrylate, caprolactone-modified dipentaerythritol hexamethacrylate, caprolactone-modified dipentaerythritol pentaacrylate, caprolactone-modified dipentaerythritol pentamethacrylate, ditrihydroxymethylpropyl tetraacrylate, ditrihydroxymethylpropyl tetramethacrylate, EO-modified bisphenol A diacrylate, EO-modified bisphenol A dimethacrylate, PO-modified bisphenol A diacrylate, PO-modified bisphenol A dimethacrylate, EO-modified hydrobisphenol A diacrylate, EO-modified hydrobisphenol A dimethacrylate, PO-modified hydrobisphenol A diacrylate, PO-modified hydrobisphenol A dimethacrylate, PO-modified tripropionin, EO-modified bisphenol F diacrylate, EO-modified bisphenol F dimethacrylate, novolac polyglycidyl ether acrylate, novolac polyglycidyl ether methacrylate, or the products such as the trade name of TO-1382 made by TOAGOSEI Co. Ltd. in Japan and the like.

Preferably, the compound having the ethylenically unsaturated group (D) is selected from the group consisting of trihydroxymethylpropyl triacrylate, EO-modified trihydroxymethylpropyl triacrylate, PO-modified trihydroxymethylpropyl triacrylate, pentaerythritol triacrylate, pentaerythritol tetraacrylate, dipentaerythritol hexaacrylate, dipentaerythritol pentaacrylate, dipentaerythritol tetraacrylate, caprolactone-modified dipentaerythritol hexaacrylate, ditrihydroxymethylpropyl tetraacrylate, PO-modified tripropionin or any combination thereof.

Based on the total amount of the aforementioned alkali-soluble resin (C) as 100 parts by weight, an amount of the compound having the ethylenically unsaturated group (D) is 60 parts by weight to 600 parts by weight, preferably 80 parts by weight to 500 parts by weight, and more preferably 100 parts by weight to 400 parts by weight.

Photo-Initiator (E)

The photo-initiator (E) can be O-acyl oxime compound, triazine compound, acetonephenone compound, biimidazole compound, benzophenone compound or the like. The aforementioned photo-initiator (E) can be used alone or in a combination of two or more.

The O-acyl oxime compound includes but is not limited to 1-[4-(phenylthio)phenyl]-heptane-1,2-dione-2-(O-benzoyl oxime), 1-[4-(phenylthio)phenyl]-octane-1,2-dione-2-(O-benzoyl oxime), 1-[4-(benzoyl)phenyl]-heptane-1,2-dione-2-(O-benzoyl oxime), 1-[9-ethyl-6-(2-methylbenzoyl)-9H-carbazol-3-yl]-ethanone-1-(O-acetyl oxime), 1-[9-ethyl-6-(3-methylbenzoyl)-9H-carbazol-3-yl]-ethanone-1-(O-acetyl oxime), 1-[9-ethyl-6-benzoyl-9H-carbazol-3-yl]-ethanone-1-(O-acetyl oxime), ethanone-1-[9-ethyl-6-(2-methyl-4-tetrahydrofuranyl benzoyl)-9H-carbazol-3-yl]-1-(O-acetyl oxime), ethanone-1-[9-ethyl-6-(2-methyl-5-tetrahydropyranyl benzoyl)-9H-carbazol-3-yl]-1-(O-acetyl oxime), ethanone-1-[9-ethyl-6-(2-methyl-4-tetrahydrofuranyl methoxybenzoyl)-9H-carbazol-3-yl]-1-(O-acetyl oxime), ethanone-1-[9-ethyl-6-(2-methyl-5-tetrahydrofuranyl methoxybenzoyl)-9H-carbazole-3-yl]-1-(O-acetyl oxime), ethanone-1-{9-ethyl-6-[2-methyl-4-(2,2-dimethyl-1,3-dioxolanyl)benzoyl]-9H-carbazol-3-yl}-1-(O-acetyl oxime), ethanone-1-{9-ethyl-6-[2-methyl-4-(2,2-dimethyl-1,3-dioxolanyl)methoxybenzoyl]-9H-carbazol-3-yl}-1-(O-acetyl oxime) or the like. The aforementioned O-acyl oxime compound can be used alone or in a combination of two or more.

The triazine compound includes but is not limited to 2,4-bis(trichloromethyl)-6-(p-methoxy)styryl-s-triazine, 2,4-bis(trichloromethyl)-6-(1-p-dimethylaminophenyl-1,3-butadienyl)-s-triazine, or 2-trichloromethyl-4-amino-6-(p-methoxy)styryl-s-triazine and the like. The aforementioned triazine compound can be used alone or in a combination of two or more.

The acetophenone compound includes but is not limited to p-dimethylamino acetophenone, α,α'-dimethoxyazoxy acetophenone, 2,2'-dimethyl-2-phenyl acetophenone, p-methoxy acetophenone, 2-methyl-1-(4-methylthio phenyl)-2-morpholino-1-acetone, 2-benzyl-2-N,N-dimethylamino-1-(4-morpholino phenyl)-1-butanone or the like. The aforementioned acetophenone compound can be used alone or in a combination of two or more.

The biimidazole compound includes but is not limited to 2,2'-bis(o-chlorophenyl)-4,4',5,5'-tetraphenyl biimidazole, 2,2'-bis(o-fluorophenyl)-4,4',5,5'-tetraphenyl biimidazole, 2,2'-bis(o-methylphenyl)-4,4',5,5'-tetraphenyl biimidazole, 2,2'-bis(o-methoxyphenyl)-4,4',5,5'-tetraphenyl biimidazole, 2,2'-bis(o-ethylphenyl)-4,4',5,5'-tetraphenyl biimidazole, 2,2'-bis(p-methoxyphenyl)-4,4',5,5'-tetraphenyl biimidazole, 2,2'-bis(2,2',4,4'-tetramethoxyphenyl)-4,4',5,5'-tetraphenyl biimidazole, 2,2'-bis(2-chlorophenyl)-4,4',5,5'-tetraphenyl biimidazole, 2,2'-bis(2,4-dichlorophenyl)-4,4',5,5'-tetraphenyl biimidazole or the like. The aforementioned biimidazole compound can be used alone or in a combination of two or more.

The benzophenone compound includes but is not limited to thiaxanthone, 2,4-diethyl thiaxanthone, thiaxanthone-4-sulfone, benzophenone, 4,4'-bis(dimethylamino)benzophenone, 4,4'-bis(diethylamino)benzophenone or the like. The benzophenone compound can be used alone or in a combination of two or more.

Preferably, the photo-initiator (E) can be 1-[4-(phenylthio) phenyl]-octane-1,2-dione-2-(O-benzoyl oxime), 1-[9-ethyl-6-(2-methylbenzoyl)-9H-carbazol-3-yl]-ethanone-1-(O-acetyl oxime), ethanone-1-[9-ethyl-6-(2-methyl-4-tetrahydrofuranyl methoxybenzoyl)-9H-carbazol-3-yl]-1-(O-acetyl oxime), ethanone-1-{9-ethyl-6-[2-methyl-4-(2,2-dimethyl-1,3-dioxolanyl)methoxybenzoyl]-9H-carbazol-3-yl}-1-(O-acetyl oxime), 2,4-bis(trichloromethyl)-6-(p-methoxy)styryl-s-triazine, 2-benzyl-2-N,N-dimethylamino-1-(4-morpholino phenyl)-1-butanone, 2,2'-bis(2,4-dichlorophenyl)-4,4',5,5'-tetraphenyl-1,2'-biimidazole, 4,4'-bis(diethylamino)benzophenone or any combination thereof.

Without adversely affecting the physical properties of the blue photosensitive resin composition, the blue photosensitive resin composition of the present invention can further be added with an initiator except from the photo-initiator (E). Examples of the initiator can be, for example, α-diketone compound, acyloin compound, acyloin ether compound, acylphosphine oxide compound, quinone compound, halogen-containing compound, peroxide compound or the like.

The α-diketone compound includes but is not limited to benzil compound, acetyl compound or the like. The aforementioned α-diketone compound can be used alone or in a combination of two or more.

The acyloin compound includes but is not limited to benzoin and the like. The aforementioned acyloin compound can be used alone or in a combination of two or more.

The acyloin ether compound includes but is not limited to benzoin methylether, benzoin ethylether, benzoin isopropyl ether or the like. The aforementioned acyloin ether compound can be used alone or in a combination of two or more.

The acylphosphineoxide compound includes but is not limited to 2,4,6-trimethyl-benzoyl diphenylphosphineoxide, bis-(2,6-dimethoxy-benzoyl)-2,4,4-trimethylphenyl phosphine oxide or the like. The aforementioned acylphosphineoxide compound can be used alone or in a combination of two or more.

The quinone compound includes but is not limited to anthraquinone, 1,4-naphthoquinone and the like. The aforementioned quinone compound can be used alone or in a combination of two or more.

The halogen-containing compound includes but is not limited to phenacyl chloride, tribromomethyl phenylsulfone, tris(trichloromethyl)-s-triazine or the like. The aforementioned compounds having a halogen atom can be used alone or in a combination of two or more.

The peroxide compound includes but is not limited to di-tertbutylperoxide and the like. The aforementioned peroxide compound can be used alone or in a combination of two or more.

Based on the total amount of the aforementioned alkali-soluble resin (C) as 100 parts by weight, an amount of the photo-initiator (E) is 10 parts by weight to 100 parts by weight, preferably 15 parts by weight to 90 parts by weight, and more preferably 20 parts by weight to 80 parts by weight.

Organic Solvent (F)

The organic solvent of the present invention includes but is not limited to a (poly)alkylene glycol monoalkyl ether solvent, such as ethylene glycol methyl ether, ethylene glycol ethyl ether, diethylene glycol methyl ether, diethylene glycol ethyl ether, diethylene glycol n-propyl ether, diethylene glycol n-butyl ether, triethylene glycol methyl ether, triethylene glycol ethyl ether, propylene glycol methyl ether, propylene glycol ethyl ether, dipropylene glycol monomethyl ether, dipropylene glycol monoethyl ether, dipropylene glycol n-propyl ether, dipropylene glycol n-butyl ether, tripropylene glycol methyl ether, tripropylene glycol ethyl ether or the like; (poly)alkylene glycol monoalkyl ether acetate solvent, such as ethylene glycol methyl ether acetate, ethylene glycol ethyl ether acetate, propylene glycol methyl ether acetate (PGMEA), propylene glycol ethyl ether acetate or the like; an other ether solvent such as diethylene glycol dimethyl ether, diethylene glycol ethyl methyl ether, diethylene glycol diethyl ether, tetrahydrofuran or the like; a ketone solvent, such as ethyl methylketone, cyclohexanone, 2-heptanone, 3-heptanone or the like; an alkyl lactate solvent such as methyl 2-hydroxypropanoate, ethyl 2-hydroxypropanoate or the like; an other ester solvent such as methyl 2-hydroxy-2-methylpropionate, ethyl 2-hydroxy-2-methylpropionate, methyl 3-methoxypropionate, ethyl 3-methoxypropionate, methyl 3-ethoxypropionate, ethyl 3-ethoxypropionate (EEP), ethyl ethoxyacetate, ethyl hydroxyacetate, methyl 2-hydroxy-3-methyl butyrate, 3-methyl-3-methoxybutyl acetate, 3-methyl-3-methoxybutyl propionate, ethyl acetate, n-propyl acetate, isopropyl acetate, n-butyl acetate, isobutyl acetate, n-pentyl acetate, isopentyl acetate, n-butyl propionate, ethyl butyrate, n-propyl butyrate, isopropyl butyrate, n-butyl butyrate, methyl pyruvate, ethyl pyruvate, n-propyl pyruvate, methyl acetoacetate, ethyl acetoacetate, ethyl 2-methoxybutyrate or the like; an aromatic hydrocarbon compound solvent such as toluene, xylene or the like; and an amide solvent such as N-methylpyrrolidone, N,N-dimethylformamide, N,N-dimethyl acetamide or the like.

Preferably, the organic solvent (F) can be propylene glycol monomethyl ether acetate or ethyl 3-ethoxypropionate.

Based on the total amount of the aforementioned alkali-soluble resin (C) as 100 parts by weight, an amount of the organic solvent (F) is 500 parts by weight to 5,000 parts by weight, preferably 800 parts by weight to 4,500 parts by weight, and more preferably 1,000 parts by weight to 4,000 parts by weight.

Additive (G)

For satisfying the requirements on the physical-chemical properties of the color filter portion, the blue photosensitive resin composition in the present invention can optionally include an additive (G) such as a filling agent, a polymer compound except from the aforementioned alkali-soluble resin (C), an adhesion promoter, an antioxidant, an ultraviolet absorber, an anti-agglutinant or the like.

The additive (G) includes but is not limited to the filler agent of glass, aluminum or the like; the polymer compound except from the alkali-soluble resin (C) such as polyvinyl alcohol, polyethylene glycol monoalkyl ether, polyfluoroalkyl acrylate or the like; the adhesion promoter such as vinyl trimethoxysilane, vinyl triethoxysilane, vinyl tris(2-methoxyethoxy)silane, N-(2-aminoethyl)-3-aminopropylmethyl dimethoxysilane, N-(2-aminoethyl)-3-aminopropyl trimethoxysilane, 3-aminopropyl triethoxysilane, 3-glycidoxypropyl trimethoxysilane, 3-glycidoxymethyl propyldimethoxysilane, 2-(3,4-epoxycyclohexyl)ethyl trimethoxysilane, 3-chloromethylpropyl dimethoxysilane, 3-chloropropyl trimethoxysilane, 3-methylallyloxypropyl trimethoxysilane, 3-mercaptopropyl trimethoxysilane or the like; the antioxidant such as 2,2-thiobis(4-methyl-6-tertbutylphenol), 2,6-di-tertbutylphenol or the like; the ultraviolet absorber such as 2-(3-tertbutyl-5-methyl-2-hydroxyphenyl)-5-chlorophenylazide, alkoxyphenyl ketone or the like; and the anti-agglutinant such as sodium polyacrylate and so on.

Preparation of Photosensitive Resin Composition

The blue photosensitive resin composition for the color filter of the present invention is prepared by mixing the abovementioned organic pigment (A), the dye (B), the alkali-soluble resin (C), the compound having the ethylenically unsaturated group (D), the photo-initiator (E) and the organic solvent (F) in a mixer uniformly until all components are formed into a solution state, optionally adding the additive (G) such as the filler agent, the polymer compound except from the alkali-soluble resin (C), the adhesion promoter, the antioxidant, the ultraviolet absorber, the anti-agglutinant or the like thereto if necessary.

Based on the total amount of the alkali-soluble resin (C) as 100 parts by weight, an amount of the organic pigment (A) is 30 parts by weight to 300 parts by weight, an amount of the dye (B) is 5 parts by weight to 50 parts by weight, an amount of the compound having the ethylenically unsaturated group (D) is 60 parts by weight to 600 parts by weight, the amount of the photo-initiator (E) is 10 parts by weight to 100 parts by weight, and the amount of the organic solvent (F) is 500 parts by weight to 5,000 parts by weight.

Preparation of Color Filter

In the preparation of the color filter for the present invention, a pixel layer is formed by using the aforementioned blue photosensitive resin of the color filter, and then the color filter is formed by the following method.

During the preparation of the color filter for the present invention, the solution state of the aforementioned blue photosensitive resin composition of the color filter is coated on a substrate mainly by a coating method such as spin coating, curtain coating, ink-jet printing, roll coating or the like. After being coated, the solvent is mostly removed by the reduced-pressure dehydration, and the residual solvent is removed by a prebake step to form a prebaked coating film. The conditions of the reduced-pressure dehydration and the prebake step can vary depending on the kinds and ratios of the ingredients. The reduced-pressure dehydration is typically performed under a pressure of 0 mmHg to 200 mmHg for 1 second to 60 seconds, and the prebake step is performed at a temperature of 70° C. to 110° C. for 1 minute to 15 minutes. Afterwards, the prebaked coating film is exposed under a given mask, in which the light used in the exposing step preferably is ultraviolet light such as g-line, h-line, i-line and the like. A (super) high-pressure mercury lamp or a metal halide lamp can be used as the ultraviolet light device. And then, the substrate is immersed in a developing solution at 23±2° C. for 15 seconds to 5 minutes, for removing the undesirable parts to form a pattern, so as to form a substrate with a photo-curing coating layer.

Examples of the aforementioned substrate can be an alkali-free glass, a Na—Ca glass, a hard glass (Pyrex glass) or a quartz glass used in the LCD device, those having an electrically conductive transparent film disposed thereon, or a substrate of the photoelectric conversion substrate (such as silica substrate) used in a solid-camera device and the like. These substrates typically have the pre-formed black matrix for isolating various pixel color layers.

Furthermore, Examples of the developing solution can be an alkaline solution containing alkali compounds such as sodium hydroxide, potassium hydroxide, sodium carbonate, sodium hydrocarbonate, potassium carbonate, potassium hydrocarbonate, sodium silicate, sodium methyl silicate, ammonium solution, ethylamine, diethylamine, dimethyl ethanolamine, tetramethyl ammonium hydroxide, tetraethyl ammonium hydroxide, choline, pyrrole, piperidine, 1,8-diazabicyclo(5,4,0)-7-undecene or the like. A concentration of the developing solution is typically 0.001 wt % to 10 wt %, preferably 0.005 wt % to 5 wt %, and more preferably 0.01 wt % to 1 wt %.

When the aforementioned alkaline water solution is utilized for the developing solution, the pattern is typically cleaned by water after being developed and air-dried by compressed air or compressed nitrogen gas.

After air-drying the substrate having the photo-curing coating layer, the substrate is heated by a heating device such as a hot plate or an oven at 100° C. to 280° C. for 1 minute to 15 minutes, so as to remove the volatile ingredients in the coating layer and to make the unreacted ethylenically unsaturated double bonds in the coating layer to perform a thermal curing reaction. The photosensitive resin compositions of various colors (mainly including three colors of red, green and blue) are applied on the given pixel and practiced repetitively by using the same procedure in three times, so as to obtain the photocured pixel color layer of red, green and blue colors.

Furthermore, an ITO (Indium Tin Oxide) evaporated film is formed on the aforementioned pixel color layer at 220° C. to 250° C. in vacuum. If necessarily, the ITO evaporated film is etched, wired and coated with the polyimide of the LC alignment film, followed by a calcination step, so as to obtain the color filter for the LCD device.

Preparation of LCD Device

The LCD device of the present invention includes the aforementioned color filter.

The LCD device of the present invention includes the aforementioned color filter substrate and a driving substrate having thin film transistor (TFT) disposed thereon. The two substrates are opposite to each other while leaving a cell gap interposed therebetween, and a sealing agent is adhered the surrounding of the two substrates. Next, the LC is injected and filled into the cell gap defined by the surfaces of the two substrates and the sealing agent, followed by sealing a gap-hole and forming an LC cell. And then, the polarized plates are respectively adhered on the external surfaces and sides of the two substrates of the LC cell, so as to obtain the LCD element.

Several embodiments are described below to illustrate the application of the present invention. However, these embodiments are not used for limiting the present invention. For those skilled in the art of the present invention, various variations and modifications can be made without departing from the spirit and the scope of the present invention.

BRIEF DESCRIPTION OF THE DRAWINGS

The invention can be more fully understood by reading the following detailed description of the embodiment, with reference made to the accompanying drawings as follows.

DETAILED DESCRIPTION

Preparation of Alkali-Soluble Resin (C)

Figure 1:
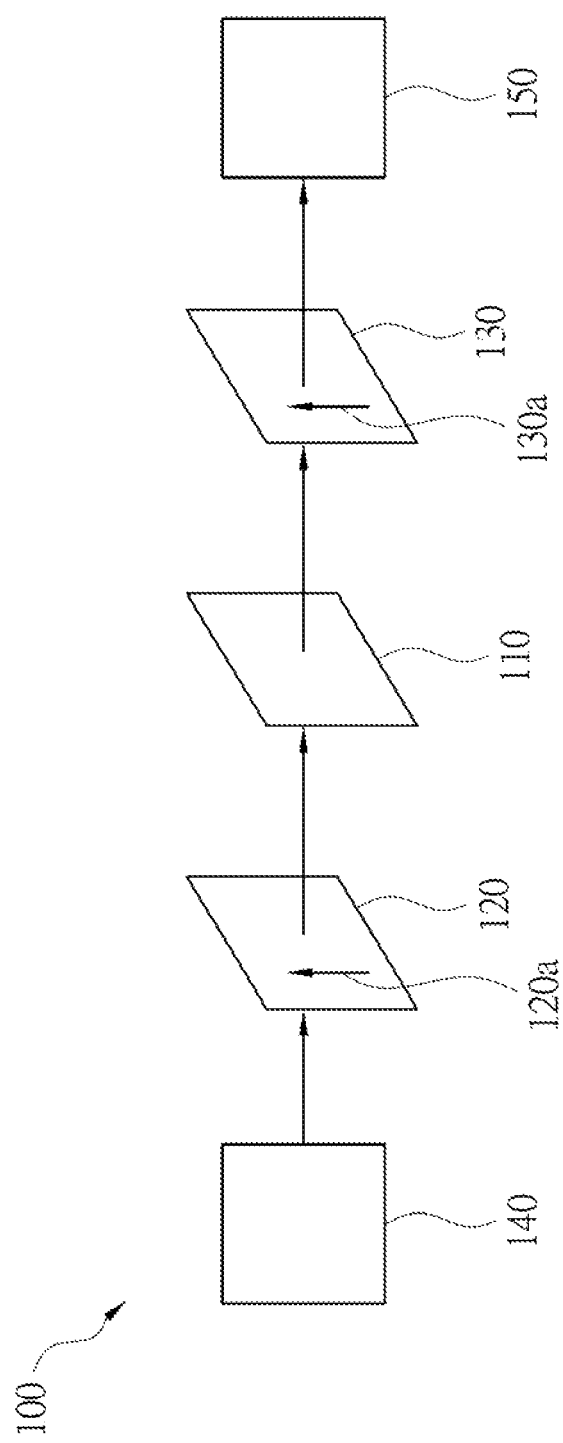
FIG. 1 is a stereo diagram of a device of detecting contrast ratio according to an evaluated method of the present invention.

Hereinafter, the alkali-soluble resins of synthesis examples C-1-1 to C-1-8 and C-2-1 to C-2-4 were prepared according to Table 1.

Preparation of First Alkali-Soluble Resin (C-1)

Synthesis Example C-1-1

3 parts by weight of 1,2,2,6,6-pentamethylpiperidyl methacrylate (hereinafter as FA-711MM), 45 parts by weight of 2-methacryloylethoxy succinate (hereinafter as HOMS), 12 parts by weight of dicyclopentenyl acrylate (hereinafter as FA-511A), 20 parts by weight of styrene (hereinafter as SM), 5 parts by weight of benzyl methacrylate (hereinafter as BzMA), 15 parts by weight of methyl methacrylate (hereinafter as MMA), 4 parts by weight of 2,2'-azo-bis-2-methylbutyronitrile (hereinafter as AMBN) and 200 parts by weight of ethyl 3-ethoxypropionate (hereinafter as EEP) were added to a 500 ml four-necked flask continuously, the feeding speed was controlled at 25 parts by weight per minute and the temperature was maintained at 100° C. After reacting for 6 hours, the first alkali-soluble resin (C-1-1) was obtained.

Synthesis Examples C-1-2 to C-1-8

Synthesis Examples C-1-2 to C-1-8 were practiced with the same method as Synthesis Example C-1-1 by using various kinds and amounts of the components of the first alkali-soluble resin and various polymerization conditions. The formulations and polymerization conditions thereof were listed in Table 1 rather than focusing or mentioning them in details.

Preparation of Second Alkali-Soluble Resin (C-2)

Synthesis Example C-2-1

A 1,000 ml four-necked conical flask equipped with a nitrogen inlet, a stirrer, a heater, a condenser and a thermometer was purged with nitrogen gas. In an environment with the nitrogen gas, 45 parts by weight of 2-methacryloylethoxy succinate (hereinafter as HOMS), 15 parts by weight of dicyclopentenyl acrylate (hereinafter as FA-511A), 20 parts by weight of styrene (hereinafter as SM), 5 parts by weight of benzyl methacrylate (hereinafter as BzMA), 15 parts by weight of methyl methacrylate (hereinafter as MMA), and 200 parts by weight of ethyl 3-ethoxypropionate (hereinafter as EEP) were added into the four-necked conical flask continuously and mixed uniformly. Then a temperature of an oil bath was increased to 100° C., and 4 parts by weight of 2,2'-azo-bis-2-methylbutyronitrile (hereinafter as AMBN) was dissolved in EEP, and the solution was divided into five equal parts in weight and the five parts were added into the four-necked conical flask in 1 hour. The reacting temperature of the polymerization process was maintained at 100° C. and reacted for 6 hours. Afterwards, a polymer product was separated from the four-necked conical flask and the solvent was removed, so as to obtain the second alkali-soluble resin (C-2-1).

Synthesis Examples C-2-2 to C-2-4

Synthesis Examples C-2-2 to C-2-4 were prepared with the same method as Synthesis Example C-2-1 by using various kinds and amounts of the components of the second alkali-soluble resin and various polymerization conditions. The formulations and polymerization conditions thereof were listed in Table 1 rather than mentioning them in details.

Preparation of Blue Photosensitive Resin Composition

Hereinafter, the blue photosensitive resin compositions of Examples 1 to 8 and Comparative Examples 1 to 7 were prepared according to Table 2 and Table 3.

Example 1

20 parts by weight of the C.I. Pigment blue 15:4 (hereinafter as A-1-1), 5 parts by weight of the aforementioned dye as the formula (I-5) (hereinafter as B-1), 100 parts by weight of the alkali-soluble resin obtained from the aforementioned Synthesis Example C-1-1 (hereinafter as C-1-1), 60 parts by weight of dipentaerythritol hexaacrylate (made by TOAGOSEI Co. Ltd., hereinafter as D-1), 3 parts by weight of 2-methyl-1-(4-methylthio phenyl)-2-morpholino-1-acetone (hereinafter as E-1), 3 parts by weight of 2,2'-bis(2,4-dichlorophenyl)-4,4',5,5'-tetraphenyl biimidazole (hereinafter as E-2), and 4 parts by weight of 4,4'-bis(diethylamino)benzophenone were added into 500 parts by weight of ethyl 3-ethoxypropionate (hereinafter as F-1), being uniformly mixed and dissolved by an mixer, so as to obtain the blue photosensitive resin composition for the color filter of Example 1. The obtained blue photosensitive resin composition for the color filter was evaluated according to the following various evaluation methods, and the results were shown in Table 2, in which the method of detecting the contrast ratio and the voltage holding ratio were described as follows.

Examples 2 to 8 and Comparative Examples 1 to 7

Examples 2 to 8 and Comparative Examples 1 to 7 were prepared with the same method as in Example 1 by using various kinds and amounts of the components of the blue photosensitive resin compositions. The formulations and evaluation results were shown in Tables 2 and 3 rather than mentioning them in details.

Evaluation Methods
1. Contrast Ratio

Each blue photosensitive resin composition of the aforementioned Examples and Comparative Examples was coated on a glass substrate with a size of 100 mm in width and 100 mm in length. Next, the glass substrate was subjected to a reduced-pressure dehydration for 30 seconds under a pressure of 100 mmHg. Then, the aforementioned glass substrate was prebaked for 3 minutes at 80° C. to form a prebaked coating film with 2.5 μm in thickness. Next, the aforementioned prebaked coating film was exposed under 300 mJ/cm² of ultraviolet light by an exposure machine (the trade name of PLA-501F was made by Canon Co. Ltd.). After being exposed under the ultraviolet light, the prebaked coating film was immersed in a developing solution at 23° C. After 2 minutes, the prebaked coating film was cleaned by pure water, followed by being postbaked at 200° C. for 80 minutes, so as to form a blue photosensitive resin layer with 2.0 μm in thickness on the glass substrate.

Figure 2:
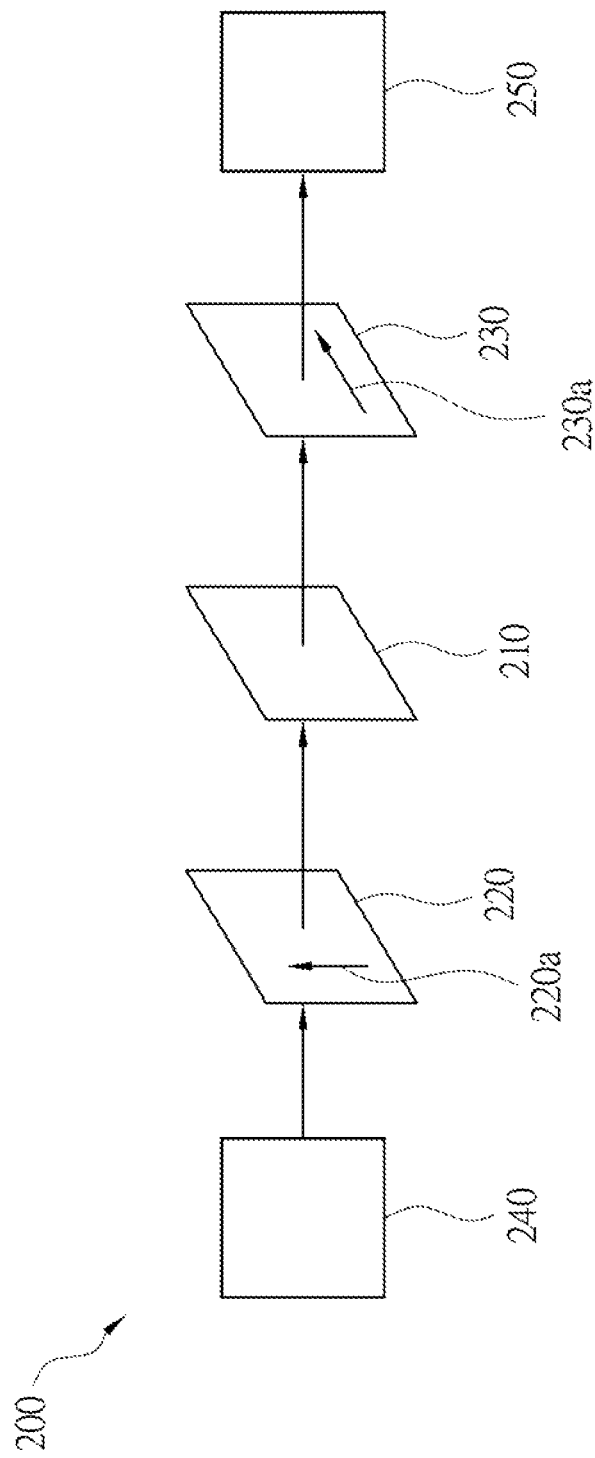
FIG. 2 is a stereo diagram of an another device of detecting contrast ratio according to the evaluated method of the present invention.

A detecting device as illustrated in FIGS. 1 and 2 was used to measure the luminance of the blue photosensitive resin layer with 2.0 μm in thickness and compute a ratio thereof. In the detecting device 100 of FIG. 1, the aforementioned produced blue photosensitive resin layer 110 was interposed between the two polarized plates 120 and 130, and the light emitted from the light source 140 passed through the polarized plate 120, the blue photosensitive resin layer 110 and the polarized plate 130 in sequence. Then, the luminance (cd/cm²) of the light passing through the polarized plate 130 was measured by a luminance meter 150 (the trade name of BM-5A was made by Topcon Co. Ltd.).

Among the aforementioned description, a polarized light direction 120a of the polarized plate 120 was parallel to a polarized light direction 130a of the polarized plate 130, and the luminance measured by the detecting device 100 of FIG. 1 was A. The detecting device 200 illustrated in FIG. 2 was approximately the same as the detecting device 100 illustrated in FIG. 1, but the two detecting devices had some differences. A polarized light direction 220a of a polarized plate 220 was perpendicular to a polarized light direction 230a of a polarized plate 230 in the detecting device 200, and the luminance measured by the device 200 was B.

Then, the contrast ratio of the blue photosensitive resin composition was defined as the following formula (III) and evaluated according to the following criterion:

$$\text{Contrast ratio} = \frac{\text{Luminance } A}{\text{Luminance } B} \quad \text{(III)}$$

⊚: 1500≤contrast ratio
◯: 1200≤contrast ratio<1500
Δ: 900≤contrast ratio<1200
X: contrast ratio<900

2. Voltage Holding Ratio

Firstly, a $SiO_2$ film was formed on a Na—Ca glass substrate for preventing sodium ions from being dissolved out, and then an ITO (Indium Tin Oxide) electrode with a given pattern was further evaporated on the Na—Ca glass substrate. And then, the resulted blue photosensitive resin compositions of the aforementioned Examples 1 to 8 and Comparative Examples 1 to 7 were spin-coated on the above-mentioned glass substrate. Next, the substrate was prebaked for 1 minute at 100° C. to form a prebaked coating film with a thickness of 2 μm. Then, the aforementioned prebaked coating film was irradiated under the light of 700 J/m² without covering the mask. The post-exposure coating film was immersed in a potassium hydroxide developing solution with the concentration of 0.04 wt %. After 1 minute, the substrate was cleaned by ultrapure water and air-dried. Afterwards, the post-exposure coating film was post-baked for 30 minutes at 230° C., thereby forming a cured coating film.

Next, a sealing agent was used to adhere the pixel substrate formed by the aforementioned curing coating film and the ITO electrode with the given evaporated pattern, and the glass beads with a diameter of 1.8 mm were placed in between thereof. The LC material (the trade name of MLC6608 was made by Merck Co. Ltd.) was injected into the cell gap defined by the aforementioned sealing agent, the pixel substrate and the driving substrate, so as to form an LC cell.

Afterwards, the produced LC cell was placed into a thermostat at 60° C., and the voltage holding ratio (VHR) of the produced LC cell was measured at a square wave of 5.5 V and a frequency of 60 Hz by a VHR measuring instrument (Model No. VHR-1A was made by Toyo Co.).

The aforementioned VHR denotes a value, which represents a potential difference of the LC cell after 16.7 milli-seconds divided by the voltage imposed to the LC cell at 0 milli-second. When the VHR of the LC cell is less than 90%, the produced LC cell is unable to maintain a stable voltage within 16.7 milli-seconds, and the situation easily causes the defect of retained image generated by the LC cell molecules. The measured VHR of the aforementioned Examples 1 to 8 and Comparative Examples 1 to 7 is evaluated by the following criteria:

⊚: 95%<VHR≤100%
◯: 90%<VHR≤95%
Δ: 80%<VHR≤90%
X: VHR≤900

Inferred from the results of Table 2 and Table 3, when the organic pigment of the blue photosensitive resin composition of the present invention (A) includes the blue organic pigment mainly having the structure of copper phthalocyanine (A-1), the resulted photosensitive resin composition will reveal preferable contrast ratio. Moreover, when the aforementioned organic pigment further containing the purple organic pigment (A-2) (A), the resulted photosensitive resin composition will reveal more preferable contrast ratio.

Furthermore, when the alkali-soluble resin of the blue photosensitive resin composition of the present invention (C) has no the first alkali-soluble resin (C-1), then the VHR of the resulted photosensitive resin composition will be poor.

It should be supplemented that, although specific compounds, components, specific reaction conditions, specific processes, specific evaluation methods or specific instruments are employed as exemplary embodiments of the present invention, for illustrating the blue photosensitive resin composition and the application of the same of the present invention. However, as is understood by a person skilled in the art instead of limiting to the aforementioned examples, the blue photosensitive resin composition and the application of the same of the present invention also can be manufactured by using other compounds, components, reaction conditions, processes, evaluation methods and instruments without departing from the spirit and the scope of the present invention.

As is understood by a person skilled in the art, the foregoing preferred embodiments of the present invention are illustrated of the present invention rather than limiting of the present invention. In view of the foregoing, it is intended to cover various modifications and similar arrangements included within the spirit and the scope of the appended claims. Therefore, the scope of which should be accorded the broadest interpretation so as to encompass all such modifications and similar structures.

TABLE 1

| Synthesis Examples | Composition (parts by weight) Copolymerizable Monomers | | | | | | | | | | |
|---|---|---|---|---|---|---|---|---|---|---|---|
| | c1 | | | c2 | | | c3 | | | | |
| | FA-711MM | FA-712HM | MATP | HOMS | MAA | AA | FA-511A | FA-512A | SM | BzMA | MMA |
| C-1-1 | 3 | | | 45 | | | 12 | | 20 | 5 | 15 |
| C-1-2 | | 5 | | | 20 | | | 35 | | 40 | |
| C-1-3 | | | 15 | 20 | | 20 | | | 25 | | 20 |
| C-1-4 | 20 | | | 55 | | | 10 | | | 15 | |
| C-1-5 | | 25 | | | 15 | | | 30 | | 10 | 20 |
| C-1-6 | | | 30 | 50 | | | | | 10 | 10 | |
| C-1-7 | 20 | 20 | | | 35 | | 5 | | 10 | | 10 |
| C-1-8 | | 15 | 30 | | | 30 | | 15 | | 10 | |
| C-2-1 | | | | 45 | | | 15 | | 20 | 5 | 15 |
| C-2-2 | | | | | 35 | | | 35 | | 30 | |
| C-2-3 | | | | 20 | | 20 | | | 30 | | 30 |
| C-2-4 | | | | 30 | | | 35 | | | 35 | |

| Synthesis Examples | Composition (parts by weight) | | | Polymerization Conditions | | |
|---|---|---|---|---|---|---|
| | Photo Initiator | | Solvent | Method of Adding Monomer | Reaction Temperature (°C.) | Polymerization Time (hr) |
| | AMBN | ADVN | EEP | | | |
| C-1-1 | 4 | | 200 | Continuously added | 100 | 6 |
| C-1-2 | 4.5 | | 200 | Simultaneously added | 105 | 6 |
| C-1-3 | 4 | | 200 | Continuously added | 100 | 5.5 |
| C-1-4 | | 4 | 200 | Simultaneously added | 105 | 6 |
| C-1-5 | 4 | | 200 | Continuously added | 100 | 6 |
| C-1-6 | 4.5 | | 200 | Simultaneously added | 105 | 6 |
| C-1-7 | 4 | | 200 | Continuously added | 100 | 5.5 |
| C-1-8 | | 4 | 200 | Simultaneously added | 105 | 6 |
| C-2-1 | 4 | | 200 | Continuously added | 100 | 6 |
| C-2-2 | 4.5 | | 200 | Simultaneously added | 105 | 6 |
| C-2-3 | 4 | | 200 | Continuously added | 100 | 5.5 |
| C-2-4 | | 4 | 200 | Simultaneously added | 105 | 6 |

FA-711MM 1,2,2,6,6-pentamethyl-piperidyl methacrylate
FA-712HM 2,2,6,6-tetramethyl-piperidyl methacrylate
MATP 4-methacrylamido-2,2,6,6-tetramethylpiperidine
HOMS 2-methacryloyloxyethyl succinate monoester
MAA methacrylic acid
AA acrylic add
FA-511A dicyclopenteny acrylate
FA-512A dicyclopentenyloxyethyl acrylate
SM styrene monomer
BzMA benzyl methacrylate
MMA methyl methacrylate
AMBN 2,2'-azobis-2-methyl butyronitrile
ADVN 2,2'-azobis(2,4-dimethylvaleronitrile)
EEP ethyl 3-ethoxypropionate

TABLE 2

| Components | | | Examples | | | | | | | |
|---|---|---|---|---|---|---|---|---|---|---|
| | | | 1 | 2 | 3 | 4 | 5 | 6 | 7 | 8 |
| Organic Pigment (A) (parts by weight) | A-1 | A-1-1 | 20 | | | 100 | | | 20 | |
| | | A-1-2 | | 50 | | | 150 | | | 200 |
| | | A-1-3 | | | 80 | | | 200 | | |
| | A-2 | A-2-1 | | | | 30 | | | 10 | |
| | | A-2-2 | | | | 20 | | | | 100 |
| Dye (B) (parts by weight) | B-1 | formula (I-5) | 5 | | | | 20 | | | |
| | B-2 | formula (I-26) | | 10 | | | 30 | 30 | | |
| | B-3 | formula (I-32) | | | 20 | | | | 40 | |
| | B-4 | formula (I-35) | | | | 30 | | | | 50 |
| Alkali-soluble Resin (C) (parts by weight) | C-1 | C-1-1 | 100 | | | | | | | |
| | | C-1-2 | | 100 | | | | | | |
| | | C-1-3 | | | 70 | | | | | |
| | | C-1-4 | | | | 50 | | | | |
| | | C-1-5 | | | | | 20 | | | |
| | | C-1-6 | | | | | | 30 | | |
| | | C-1-7 | | | 30 | | | | 50 | |
| | | C-1-8 | | | | | 50 | | | 70 |

TABLE 2-continued

|  | Components |  | Examples |  |  |  |  |  |  |  |
|---|---|---|---|---|---|---|---|---|---|---|
|  |  |  | 1 | 2 | 3 | 4 | 5 | 6 | 7 | 8 |
|  | C-2 | C-2-1 |  |  |  |  | 80 |  |  |  |
|  |  | C-2-2 |  |  |  |  |  | 70 |  |  |
|  |  | C-2-3 |  |  |  |  |  |  | 50 |  |
|  |  | C-2-4 |  |  |  |  |  |  |  | 30 |
| Compound having | D-1 |  | 60 |  |  | 300 |  |  | 80 |  |
| unsaturated | D-2 |  |  | 100 |  |  | 200 |  |  | 600 |
| ethylenically group (D) (parts by weight) | D-3 |  |  |  | 150 |  | 100 | 450 |  |  |
| Photo-initiator (E) | E-1 |  | 3 | 10 |  | 20 | 30 |  | 15 | 50 |
| (parts by weight) | E-2 |  | 3 | 20 | 30 | 20 | 30 | 20 | 30 |  |
|  | E-3 |  | 4 |  |  | 10 |  | 25 |  | 25 |
|  | E-4 |  |  |  | 10 | 10 |  |  | 30 | 25 |
| Organic Solvent | F-1 |  | 500 | 1000 | 2000 | 2500 | 3000 | 4000 |  | 2000 |
| (F) (parts by weight) | F-2 |  |  |  |  |  |  |  | 2500 | 3000 |
| Additive (G) | G-1 |  |  |  |  | 1 |  |  |  |  |
| (parts by weight) | G-2 |  |  |  |  |  |  |  |  | 5 |
| Evaluation | Contrast Ratio |  | ○ | ○ | ○ | ◎ | ○ | ○ | ◎ | ◎ |
|  | VHR |  | ◎ | ◎ | ◎ | ◎ | ○ | ◎ | ◎ | ◎ |

TABLE 3

|  | Components |  | Comparative Examples |  |  |  |  |  |  |
|---|---|---|---|---|---|---|---|---|---|
|  |  |  | 1 | 2 | 3 | 4 | 5 | 6 | 7 |
| Organic Pigment | A-1 | A-1-1 |  |  | 100 |  |  |  | 150 |
| (A) |  | A-1-2 |  |  |  | 100 |  |  |  |
| (parts by weight) |  | A-1-3 |  |  |  |  | 120 |  |  |
|  | A-2 | A-2-1 |  |  | 10 |  | 20 |  |  |
|  |  | A-2-2 |  |  |  | 10 |  |  | 30 |
| Dye (B) | B-1 | formula (I-5) | 50 |  |  |  |  |  |  |
| (parts by weight) | B-2 | formula (I-26) |  | 50 |  |  |  |  |  |
|  | B-3 | formula (I-32) |  |  |  |  | 20 |  |  |
|  | B-4 | formula (I-35) |  |  |  |  |  | 50 |  |
| Alkali-soluble | C-1 | C-1-1 | 100 |  |  |  |  |  |  |
| Resin (C) |  | C-1-2 |  | 50 |  |  |  |  |  |
| (parts by weight) |  | C-1-3 |  |  | 100 |  |  |  |  |
|  |  | C-1-4 |  |  |  | 50 |  |  |  |
|  |  | C-1-5 |  |  |  |  |  |  |  |
|  |  | C-1-6 |  |  |  |  |  |  |  |
|  |  | C-1-7 |  |  |  |  |  |  |  |
|  |  | C-1-8 |  |  |  |  |  |  |  |
|  | C-2 | C-2-1 |  |  |  | 50 |  |  |  |
|  |  | C-2-2 |  |  |  |  | 100 |  |  |
|  |  | C-2-3 |  |  |  |  |  | 100 |  |
|  |  | C-2-4 |  | 50 |  |  |  |  | 100 |
| Compound having | D-1 |  | 80 |  |  | 150 |  |  | 300 |
| unsaturated | D-2 |  |  | 80 |  |  | 200 |  |  |
| ethylenically group (D) (parts by weight) | D-3 |  |  |  | 150 |  |  | 80 |  |
| Photo-initiator (E) | E-1 |  | 10 | 10 | 20 | 20 |  | 10 | 30 |
| (parts by weight) | E-2 |  | 20 | 20 | 20 | 20 | 10 | 20 |  |
|  | E-3 |  |  |  |  |  | 20 |  | 10 |
|  | E-4 |  |  |  | 10 | 10 | 30 |  | 10 |
| Organic Solvent | F-1 |  | 1000 | 1000 | 2500 |  | 3000 |  | 3000 |
| (F) (parts by weight) | F-2 |  |  |  |  | 2500 |  | 1000 |  |
| Additive (G) | G-1 |  |  |  |  |  |  |  |  |
| (parts by weight) | G-2 |  |  |  |  |  |  |  |  |
| Evaluation | Contrast Ratio |  | X | X | X | X | ○ | X | X |
|  | VHR |  | ○ | ○ | ○ | ○ | X | X | X |

A-1-1 C.I. Pigment Blue 15:4
A-1-2 C.I. Pigment Blue 15:6
A-1-3 C.I. Pigment Blue 60
A-2-1 C.I. Pigment Purple 19
A-2-2 C.I. Pigment Purple 23
B-1 Dye as shown in formula (I-5)
B-2 Dye as shown in formula (I-26)
B-3 Dye as shown in formula (I-32)
B-4 Dye as shown in formula (I-35)
D-1 Dipentaerythritol hexaacrylate (made by Toagosei Co. Ltd)
D-2 Trihydromethylpropyl triacrylate D-3 TO-1382 (made by Toagosei Co. Ltd)
E-1 2-Methyl-1-(4-methyl thiol benzyl)-2-morpholines-1-acetone
E-2 2,2'-Bis(2-dichlorophenyl)-4,4'5,5'-tetraphenyl-1,2'-bi-imidazole
E-3 4,4'-Bis(diethylamine)benzophenone
E-4 1-(4-Phenyl-thio-phenyl)-octane-1.2-dion 2-oxime-O-benzoate
F-1 Ethyl 3-ethoxypropionate
F-2 Propylene Glycol Mono-methyl Ether Acetate
G-1 3-Sulfanol propyl trimethoxylsilane
G-2 2,2-Thio bis(4-methyl-6-tertbutylphenol)

What is claimed is:

1. A blue photosensitive resin composition for a color filter, comprising:
an organic pigment (A);
a dye (B), comprising a red dye,
wherein the red dye having a structure of formula (I):

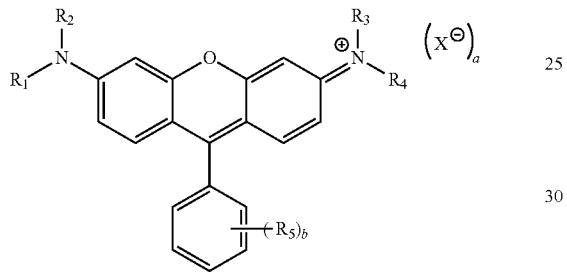

formula (I)

in the formula (I), the $R_1$ to the $R_4$ individually and independently represents a hydrogen atom, $—R_6$, an aromatic hydroxyl group having 6 to 10 carbon atoms or the aromatic hydroxyl group having 6 to 10 carbon atoms substituted by a halogen atom, $—R_6$, $—OH$, $—OR_6$, $—SO_3^-$, $—SO_3H$, $—SO_3M$, $—COOH$, $—COOR_6$, $—SO_3R_6$, $—SO_2NHR_8$ or $—SO_2NR_8R_9$; the $R_5$ represents $—SO_3^-$, $—SO_3H$, $—SO_3M$, $—COOH$, $—COOR_6$, $—SO_3R_6$, $—SO_2NHR_8$ or $—SO_2NR_8R_9$; the b represents an integer of 0 to 5, and when the b is 2 to 5, a plurality of the $R_5$ is the same or different from each other; the X represents a halogen atom; the a represents 0 or 1; the $R_6$ represents an alkyl group of 1 to 10 carbon atoms or the alkyl group substituted by a halogen atom, wherein the $—CH_2—$ in the alkyl group of 1 to 10 carbon atoms or the alkyl group substituted by the halogen atom is unsubstituted or substituted by $—O—$, carbonyl group or $—NR_7—$; the $R_7$ represents an alkyl group of 1 to 10 carbon atoms or the alkyl group substituted by the halogen atom; the $R_8$ and the $R_9$ represents independently and individually the linear or the branched alkyl group of 1 to 10 carbon atoms, cycloalkyl groups of 3 to 30 carbon atoms or -Q, wherein a hydrogen atom in the linear or branched alkyl group of 1 to 10 carbon atoms, or in the cycloalkyl group of 3 to 30 carbon atoms, is unsubstituted or substituted by a substituent, the substituent is selected from the group consisting of a hydroxyl group, a halogen atom, -Q, $—CH=CH_2$ and $—CH=CH—R_6$, and the $—CH_2—$ group in the linear or branched alkyl group of 1 to 10 carbon atoms, or in the cycloalkyl group of 3 to 30 carbon atoms, is unsubstituted or substituted by $—O—$, carboxyl group or $—NR_7—$; the $R_8$ and the $R_9$ are bound to form a heterocyclic group of 1 to 10 carbon atoms, wherein a hydrogen atom in the heterocyclic group of 1 to 10 carbon atoms is unsubstituted or substituted by $—R_6$, $—OH$ or -Q; the Q represents an aromatic hydroxyl group of 6 to 10 carbon atoms, a heterocyclic aromatic group of 5 to 10 carbon atoms, an aromatic hydroxyl group of 6 to 10 carbon atoms substituted by $—R_6$, $—OH$, $—OR_6$, $—NO_2$, $—CH=CH_2$ or $—CH=CH—R_6$, or a heterocyclic aromatic group of 5 to 10 carbon atoms substituted by a halogen atom, $—R_6$, $—OH$, $—OR_6$, $—NO_2$, $—CH=CH_2$ or $—CH=CH—R_6$; and the M represents potassium or sodium;
an alkali-soluble resin (C), comprising a first alkali-soluble resin (C-1) having a hindered-amine structure as shown in formula (II), and the first alkali-soluble resin (C-1) is copolymerized by an ethylenically monomer having a hindered-amine structure (c1), an ethylenically unsaturated monomer having one or more carboxyl groups (c2) and an other copolymerizable ethylenically unsaturated monomer (c3) except from the ethylenically monomer having the hindered-amine structure (c1) and the ethylenically unsaturated monomer having one or more carboxyl groups (c2):

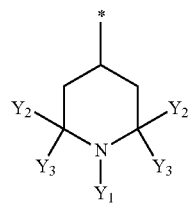

formula (II)

in the formula (II), the $Y_1$ represents a hydrogen atom, a linear-, branched- or cyclo-alkyl group of 1 to 18 carbon atoms, an aromatic alkyl group of 6 to 20 carbon atoms, an aromatic alkyl group, an acyl group, an oxygen free radical or $—OY_4$; the $Y_4$ represents a hydrogen atom, a linear-, branched- or cycloalkyl group of 1 to 18 carbon atoms, an aromatic group of 6 to 20 carbon atoms, or an aromatic alkyl group of 7 to 12 carbon atoms; the $Y_2$ and the $Y_3$ represents methyl, ethyl, phenyl or aliphatic ring formed by 4 to 12 carbon atoms; the symbol * represents a covalent bond, and based on the total amount of the ethylenically monomer having the hindered-amine structure (c1), the ethylenically unsaturated monomer having one or more carboxyl groups (c2) and the other copolymerizable ethylenically unsaturated monomer (c3) as 100 parts by weight, an amount of the ethylenically monomer having the hindered-amine structure (c1) is larger than 20 parts by weight and less than or equal to 45 parts by weight;
a compound having an ethylenically unsaturated group (D);
a photo initiator (E); and
an organic solvent (F).

2. The blue photosensitive resin composition for the color filter of claim 1, wherein based on a total amount of the alkali-soluble resin (C) as 100 parts by weight, an amount of the organic pigment (A) is 30 parts by weight to 300 parts by weight, an amount of the dye (B) is 5 parts by weight to 50 parts by weight, an amount of the compound having the ethylenically unsaturated group (D) is 60 parts by weight to 600 parts by weight and an amount of the photo-initiator (E)

is 10 parts by weight to 100 parts by weight, and an amount of the organic solvent (F) is 500 parts by weight to 5,000 parts by weight.

3. The blue photosensitive resin composition for the color filter of claim 1, wherein the organic pigment (A) comprises a blue organic pigment (A-1), wherein mainly having a structure of copper phthalocyanine.

4. The blue photosensitive resin composition for the color filter of claim 3, wherein based on the total amount of alkali-soluble resin (C) as 100 parts by weight, the amount of the copper phthalocyanine-based blue organic pigment (A-1) is 20 parts by weight to 200 parts by weight.

5. The blue photosensitive resin composition for the color filter of claim 1, wherein the organic pigment (A) consisting of a purple organic pigment (A-2).

6. The blue photosensitive resin composition for the color filter of claim 5, wherein based on the total amount of the alkali-soluble resin (C) is 100 parts by weight, an amount of the purple organic pigment (A-2) is 10 parts by weight to 100 parts by weight.

7. The blue photosensitive resin composition for the color filter of claim 1, wherein based on the total amount of the alkali-soluble resin (C) as 100 parts by weight, the amount of the first alkali-soluble resin (C-1) is 30 parts by weight to 100 parts by weight.

8. A method of manufacturing a color filter, comprising:
forming a pixel layer by using a blue photosensitive resin composition for a color filter, wherein the blue photosensitive resin composition for a color filter comprises:
an organic pigment (A);
a dye (B), comprising a red dye, wherein the red dye having a structure of formula (I):

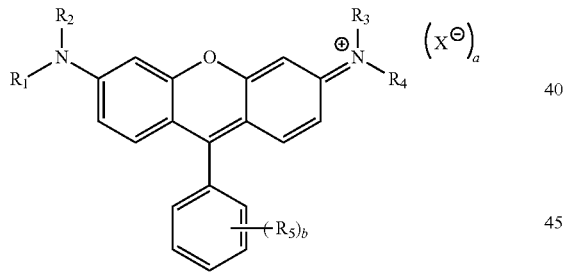

formula (I)

in the formula (I), the $R_1$ to the $R_4$ individually and independently represents a hydrogen atom, $—R_6$, an aromatic hydroxyl group having 6 to 10 carbon atoms or the aromatic hydroxyl group having 6 to 10 carbon atoms substituted by a halogen atom, $—R_6$, $—OH$, $—OR_6$, $—SO_3^-$, $—SO_3H$, $—SO_3M$, $—COOH$, $—COOR_6$, $—SO_3R_6$, $—SO_2NHR_8$ or $—SO_2NR_8R_9$; the $R_5$ represents $—SO_3^-$, $—SO_3H$, $—SO_3M$, $—COOH$, $—COOR_6$, $—SO_3R_6$, $—SO_2NHR_8$ or $—SO_2NR_8R_9$; the b represents an integer of 0 to 5, and when the b is 2 to 5, a plurality of the $R_5$ is the same or different from each other; the X represents a halogen atom; the a represents 0 or 1; the $R_6$ represents an alkyl group of 1 to 10 carbon atoms or the alkyl group substituted by a halogen atom, wherein the $—CH_2—$ in the alkyl group of 1 to 10 carbon atoms or the alkyl group substituted by a halogen atom is unsubstituted or substituted by $—O—$, carbonyl group or $—NR_7—$; the $R_7$ represents an alkyl group of 1 to 10 carbon atoms or the alkyl group substituted by a halogen atom; the $R_8$ and the $R_9$ represents independently and individually the linear or branched alkyl group of 1 to 10 carbon atoms, cycloalkyl group of 3 to 30 carbon atoms, or -Q, wherein a hydrogen atom in the linear or branched alkyl group of 1 to 10 carbon atoms, or in the cycloalkyl group of 3 to 30 carbon atoms are unsubstituted or substituted by a substituent, the substituent is selected from the group consisting of a hydroxyl group, a halogen atom, -Q, $—CH=CH_2$ and $—CH=CH—R_6$, and the $—CH_2—$ group in the linear or branched alkyl group of 1 to 10 carbon atoms, or in the cycloalkyl group of 3 to 30 carbon atoms is unsubstituted or substituted by $—O—$, carboxyl group or $—NR_7—$; the $R_8$ and $R_9$ are bound to form a heterocyclic group of 1 to 10 carbon atoms, wherein a hydrogen atom in the heterocyclic group of 1 to 10 carbon atoms are unsubstituted or substituted by $—R_6$, $—OH$ or -Q; the Q represents an aromatic hydroxyl group of 6 to 10 carbon atoms, a heterocyclic aromatic group of 5 to 10 carbon atoms, an aromatic hydroxyl group of 6 to 10 carbon atoms substituted by $—R_6$, $—OH$, $—OR_6$, $—NO_2$, $—CH=CH_2$ or $—CH=CH—R_6$, or a heterocyclic aromatic group of 5 to 10 carbon atoms substituted by a halogen atom, $—R_6$, $—OH$, $—OR_6$, $—NO_2$, $—CH=CH_2$ or $—CH=CH—R_6$; and the M represents potassium or sodium;

an alkali-soluble resin (C), comprising a first alkali-soluble resin (C-1) having a hindered-amine structure as shown in formula (II), and the first alkali-soluble resin (C-1) is copolymerized by an ethylenically monomer having a hindered-amine structure (c1), an ethylenically unsaturated monomer having one or more carboxyl groups (c2) and an other copolymerizable ethylenically unsaturated monomer (c3) except from the ethylenically monomer having the hindered-amine structure (c1) and the ethylenically unsaturated monomer having one or more carboxyl groups (c2):

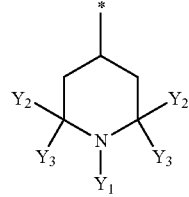

formula (II)

in the formula (II), the $Y_1$ represents a hydrogen atom, a linear-, branched- or cyclo- alkyl group of 1 to 18 carbon atoms, an aromatic alkyl group of 6 to 20 carbon atoms, an aromatic alkyl group, an acyl group, an oxygen free radicals or $—OY_4$; the $Y_4$ represents a hydrogen atom, a linear-, branched- or cycloalkyl group of 1 to 18 carbon atoms, an aromatic group of 6 to 20 carbon atoms, or an aromatic alkyl group of 7 to 12 carbon atoms; the $Y_2$ and the $Y_3$ represents methyl, ethyl, phenyl or aliphatic ring formed by 4 to 12 carbon atoms; the symbol *represents a covalent bond, and based on the total amount of the ethylenically monomer having the hindered-amine structure (c1), the ethylenically unsaturated monomer having one or more carboxyl groups (c2) and the other copolymerizable ethylenically unsaturated monomer (c3) as 100 parts by weight, an amount of the ethylenically monomer having the hindered-amine structure (c1) is larger than 20 parts by weight and less than or equal to 45 parts by weight;

a compound having an ethylenically unsaturated group (D);

a photo initiator (E); and an organic solvent (F).

9. A color filter produced by the method of claim 8.

10. A liquid crystal display device comprising the color filter of claim 9.

* * * * *